United States Patent
Motoki et al.

(10) Patent No.: US 6,413,627 B1
(45) Date of Patent: Jul. 2, 2002

(54) GAN SINGLE CRYSTAL SUBSTRATE AND METHOD OF PRODUCING SAME

(75) Inventors: Kensaku Motoki; Takuji Okahisa; Naoki Matsumoto; Tatsuya Nishimoto, all of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/333,879

(22) Filed: Jun. 15, 1999

(30) Foreign Application Priority Data

Jun. 18, 1998 (JP) .......................... 10-171276
Jun. 30, 1998 (JP) .......................... 10-183446

(51) Int. Cl.[7] ............................ B32B 5/16; C01B 21/06; C30B 29/38
(52) U.S. Cl. ...................... 428/332; 117/952; 423/409
(58) Field of Search ................... 428/323, 328, 428/402, 332; 423/409; 117/952

(56) References Cited

U.S. PATENT DOCUMENTS 6,071,795 A * 6/2000 Cheung et al. ............. 438/458
6,252,261 B1 * 6/2001 Usui et al. .................. 257/190
6,254,675 B1 * 7/2001 Aldinger et al. ............. 117/89
6,277,664 B1 * 8/2001 Lozykowski et al. ......... 438/22

FOREIGN PATENT DOCUMENTS

JP 5-183189 7/1993
JP 6-260680 9/1994

OTHER PUBLICATIONS

S. Nakamura et al., "High Power, Long–Lifetime InGaN/GaN/AlGaN–Based Laser Diodes Grown on Pure GaN Substrate", Jpn. J. Appl. Phys. vol. 37 (1998) pp. L309–L312.

A. Kuramata et al., "InGaN Laser Diode Grown on 6J–SiC Substrate Using Low–Pressure Metal Organic Vapor Phase Epitaxy", Jpn. J. Appl. Phys. vol. 36 (1997) pp. 1130–L1132.

"Thick Layer Growth of GaN by Hydride Vapor Phase Epitaxy", Collection of Theses of Electronic Information Communication Society, C–II vol. J81–C–II No. 1 pp. 58–64, Jan., 1998, and its English version.

* cited by examiner

*Primary Examiner*—Hoa T. Le
(74) *Attorney, Agent, or Firm*—Smith, Gambrell & Russell, LLP

(57) ABSTRACT

A freestanding GaN single crystal substrate is made by the steps of preparing a (111) GaAs single crystal substrate, forming a mask having periodically arranged windows on the (111) GaAs substrate, making thin GaN buffer layers on the GaAs substrate in the windows of the mask, growing a GaN epitaxial layer on the buffer layers and the mask by an HVPE or an MOC, eliminating the GaAs substrate and the mask away and obtaining a freestanding GaN single crystal substrate. The GaN single crystal has a diameter larger than 20 mm and a thickness more than 0.07 mm, being freestanding and substantially distortion-free.

14 Claims, 13 Drawing Sheets

Fig.6 (1)
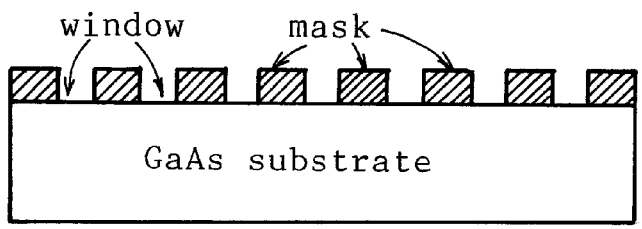
Fig.6 (2)
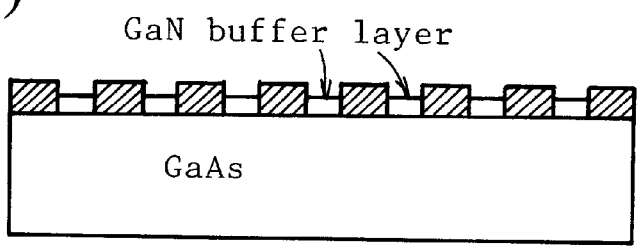
Fig.6 (3)
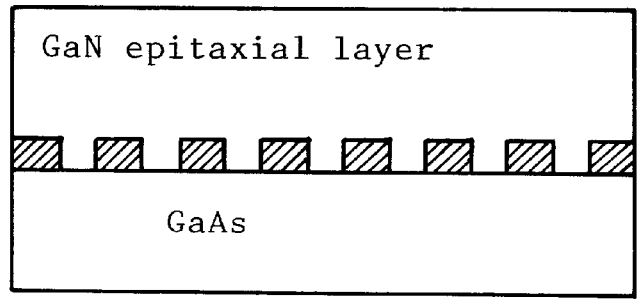
Fig.6 (4)

Fig.7 (1)
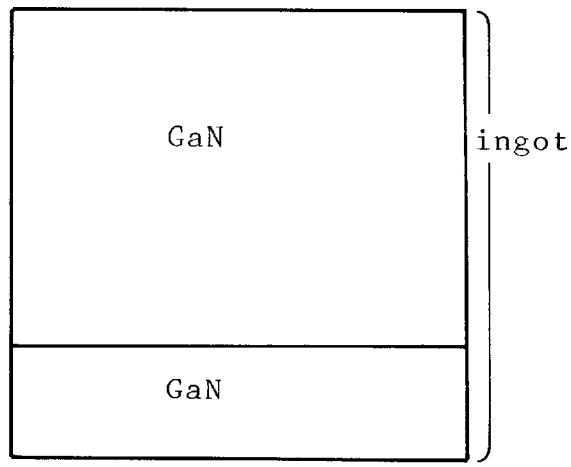
Fig.7 (2)
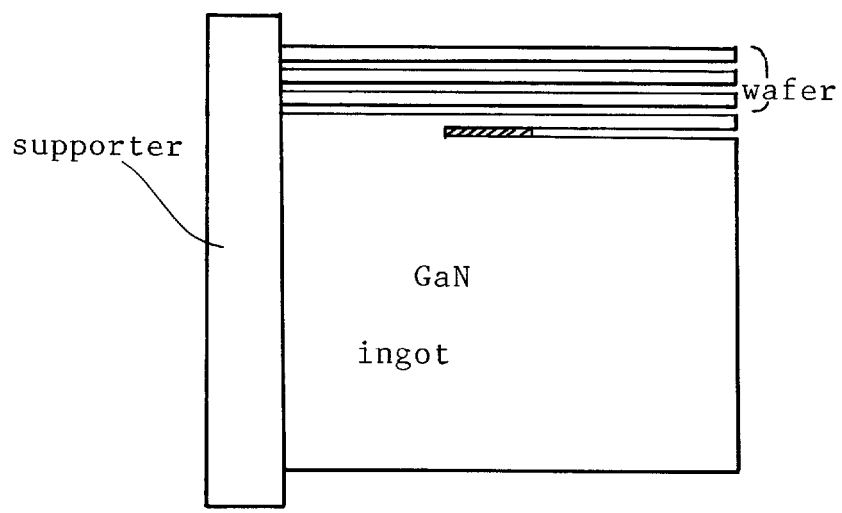
Fig.7 (3)
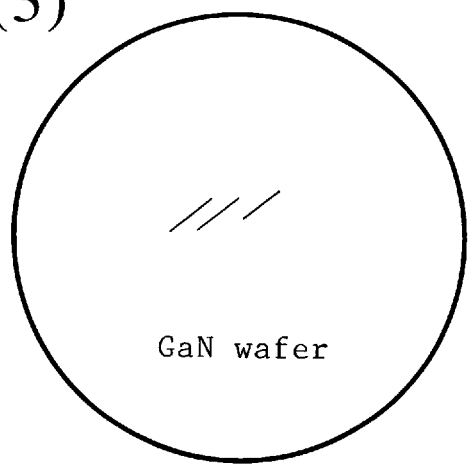

Fig. 15(a) before polishing
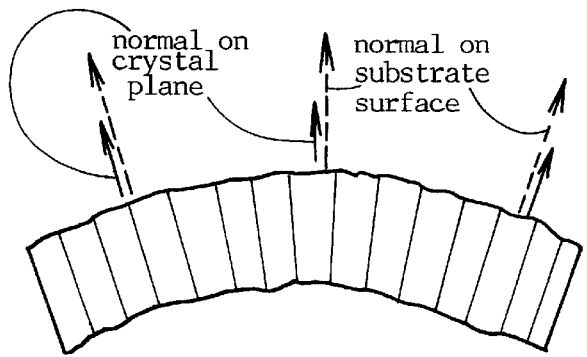
Fig. 15(b) after polishing
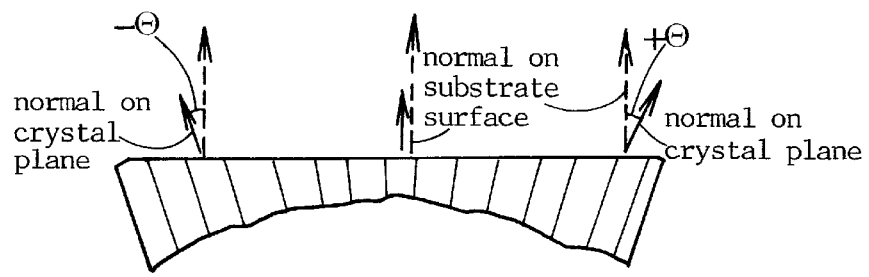
Fig. 15(c)
after polishing
definition of fluctuation angle of
normals on crystal planes
fluctuation angle of
normals on crystal planes
upon the whole surface
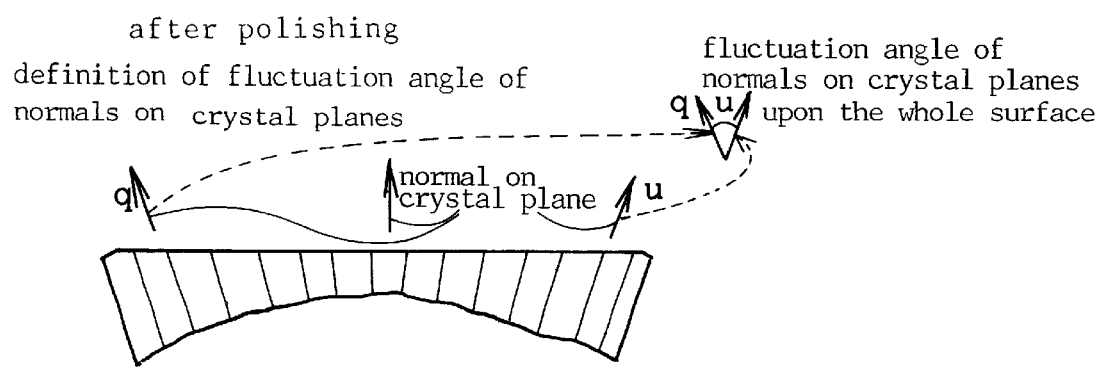

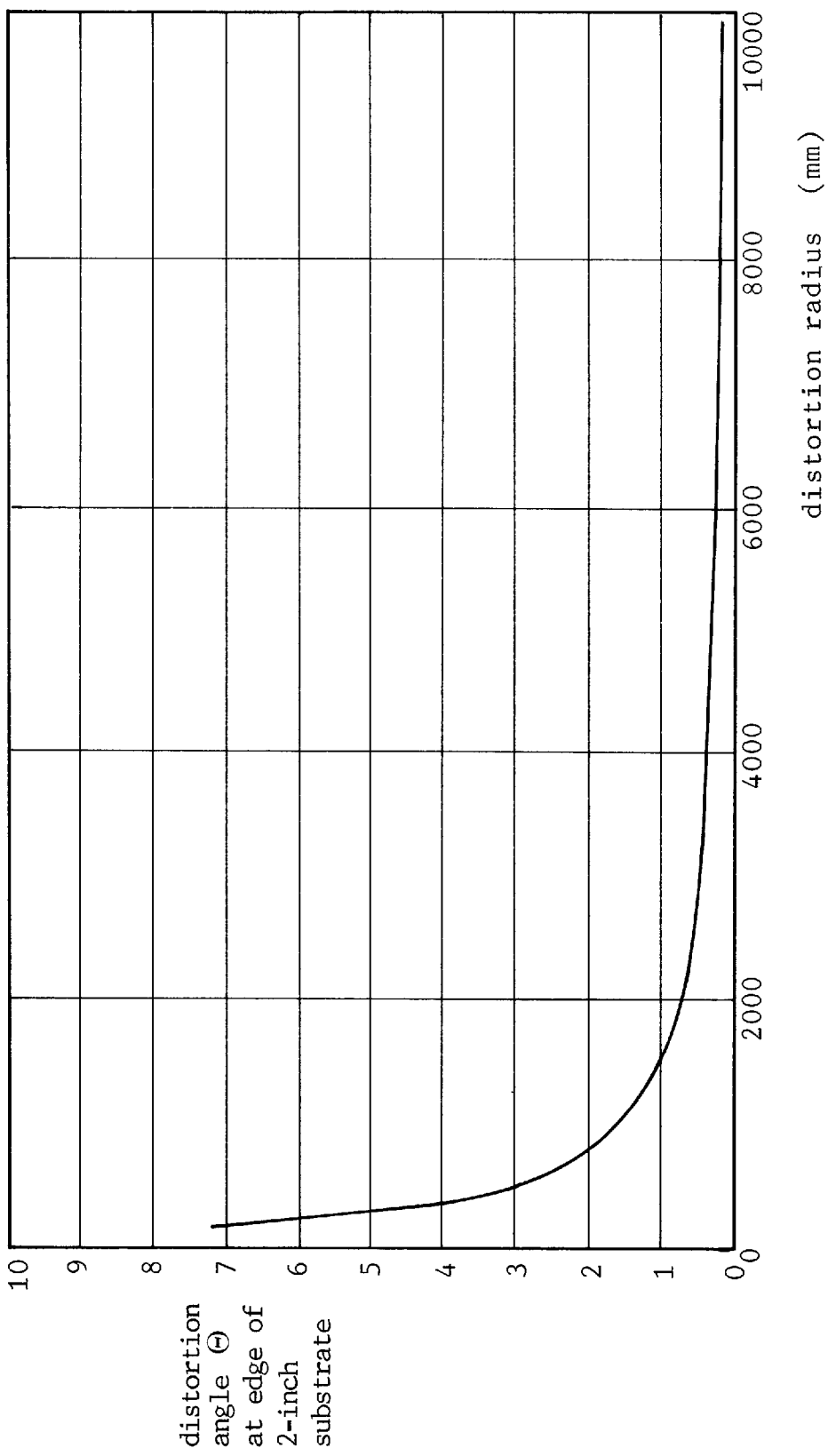

GAN SINGLE CRYSTAL SUBSTRATE AND METHOD OF PRODUCING SAME

BACKGROUND OF THE INVENTION

1. Field of the Invention

This invention relates to a GaN single crystal substrate for making blue light LEDs (light emitting diodes) or blue light LDs (laser diodes) based upon III–V group nitride (GaN-like) semiconductors.

This application claims the priority of Japanese Patent Applications No.10-171276(171276/1998) filed on Jun. 18, 1998 and No.10-183446(183446/1998) filed on Jun. 30, 1998, which are incorporated herein by reference.

2. Description of Prior Art

FIG. 1 shows the ratios of the lattice constant and the thermal expansion coefficient of the candidate materials for the substrate of growing GaN to those of GaN. Here, candidate substrates for GaN growth are sapphire ($Al_2O_3$), silicon carbide (SiC), silicon (Si), gallium arsenide (GaAs) and zinc oxide (ZnO). The nitride semiconductor light source devices, or GaN-group light source devices have been produced by piling GaN or GaN-like films epitaxially upon a sapphire substrate ($Al_2O_3$). The sapphire substrate is endowed with high chemical stability and high heat resistance. Sapphire is rigid. Although the lattice constant of sapphire is different from that of GaN by about 16%, GaN crystal can grow epitaxially on a sapphire substrate by interposing a GaN buffer film. For this reason, sapphire is exclusively used as a substrate for the GaN crystal growth. Since there is no means of eliminating the sapphire substrate, the GaN-group LEDs having the sapphire substrate are utilized for practical purposes. The current GaN-LEDs (more strictly; GaInN-LEDs) are complex devices including GaN and sapphire. The GaN/sapphire LEDs are already practical devices on the market at present. It is said that GaN/sapphire LDs (laser diodes) will be sold on the market in near future.

Sapphire ($Al_2O_3$) is different from GaN in the lattice constant. In spite of the large difference of the lattice constant, a sapphire substrate enables GaN crystal to grow epitaxially on it. The reason is the occurrence of gradual lattice relaxation. FIG. 2 shows the relation between the film thickness and the lattice constant of GaN films on sapphire. At the limit of 0 thickness, the lattice constant is equal to that of sapphire. The lattice constant of GaN film on sapphire slowly decreases to that of GaN as the GaN film thickness increases. At present, sapphire is the best material for the substrate of growing GaN films. All the GaN-LEDs on sale have the structure of GaN/$Al_2O_3$. The conventional structure of GaN/sapphire is explained, for example, by;

① Japanese Patent Laying Open No. 5-183189 (183189/'93) and

② Japanese Patent Laying Open No. 6-260680(260680/'94).

The best sapphire substrate still has a problem. The defect density in the GaN film on a sapphire substrate is very large. The defect density is about $10^9$ $cm^{-2}$ in the GaN on sapphire. The high density of defects may originate from the misfit of the lattice constant between GaN and sapphire. Defects prevail in the GaN. However, GaInN-LEDs are gifted with a long lifetime. The high density of defects may be a problem on crystallography but is not a practical problem in the GaN-LEDs. The sapphire substrate has another drawback from the mechanical viewpoint. Sapphire is chemically stable and physically rigid. The high stability against chemicals is a drawback as well as a merit. Any chemicals can not remove only the sapphire substrate, keeping the GaN films intact. The most inconvenient matter is the lack of cleavage. Since sapphire has no cleavage planes, the GaN/sapphire wafer is diced by pushing blades upon the sapphire wafer forcibly. Sometimes the wafer is broken. The yield of dicing is low. The lack of cleavage and the rigidity enhance the difficulty of dicing a GaN/sapphire wafer into plenty of device chips. Rigidity and non-cleavage are the most serious difficulty of sapphire substrates.

③ S. Nakamura et al., "High-Power, Long-Lifetime InGaN/GaN/AlGaN-Based Laser Diodes Grown on Pure GaN Substrates", Jpn. J. Appl. Phys. Vol.37 (1998)pp.L309-L312, shows an experiment of obtaining a GaN wafer by eliminating the sapphire substrate by polishing. However, this example is only on a laboratory scale.

Somebody tried to replace the sapphire substrate by silicon carbide SiC having cleavage planes. A GaN/SiC device was proposed by;

④ A. Kuramata et al., "InGaN Laser Diode Grown on 6H-SiC Substrate Using Low-Pressure Metal Organic Vapor Phase Epitaxy", Jpn. J. Appl. Phys. Vol.36(1997) pp.L1130-L1132.

SiC, however, has drawbacks. SiC has so high chemical stability that high temperature more than 1500° C. is required for producing SiC single crystals. Namely, difficulty lies at the production of SiC crystals. The SiC substrate itself is still expensive. The SiC will raise the cost of GaN/SiC devices. In practice, the GaN/SiC devices have not been made on a large scale yet. SiC is not matured to a practical material of substrates.

Prior GaN-LEDs are produced on sapphire substrates. The sapphire substrate cannot be eliminated. The sapphire substrates accompany the GaN devices in use at present. The GaN-LED devices at present may be called a "GaN/sapphire complex" device.

The substrate must be heated at a temperature higher than 1000° C. in a furnace for growing GaN-type films epitaxially on the substrate. The vapor phase reaction requires such a high temperature. When the GaN-type epitaxial films have been grown on the substrate, the substrate with the epitaxial films is cooled to room temperature for getting out of the furnace. Cooling causes undesirable influences on the GaN films due to the difference of thermal expansion coefficients between the GaN films and the substrate. Strictly speaking, the thermal expansion coefficients are not constants but variables as a function of temperature. Ignoring the small temperature dependence, rough estimation teaches us that GaAs has thermal expansion coefficient of about 1.08 times as big as GaN. In the normalized unit GaN=1, the thermal coefficients are 1.08 for GaAs, 0.87 for SiC and 1.36 for sapphire ($Al_2O_3$).

The difference of thermal expansion coefficients between the films and the substrate causes a first problem of occurrence of thermal stress in the GaN films. The thermal stress induces microcracks and other defects in the GaN films. A further problem is the fact that the thermal expansion coefficient difference invites distortion of the substrate in the cooling process. The whole epitaxial wafer having the substrate and the films deforms due to the thermal expansion discrepancy. A third problem is impossibility of making a large complex GaN/sapphire substrate. The complex GaN/sapphire might be called a GaN substrate. But, large distortion and big stress prevent manufactures from producing large GaN/sapphire wafers. Someone reported a success of making a GaN crystal of a several millimeter square which is not available to a mass production on industrial scale.

Many attempts had been made long years before to make GaN crystals on GaAs substrates. As shown in FIG. 1, GaAs has a thermal expansion coefficient nearly equal to GaN. GaAs had been a promising candidate as a substrate of GaN growth. The GaAs substrate, however, had a serious drawback. The high temperature at the growth forced As to evaporate from the surface of the GaAs crystal due to the high dissociation pressure of As at high temperature. The GaAs substrate reacts with ammonia $NH_3$. These reasons forbade a GaAs substrate from growing a good GaN crystal thereupon. All the trials had failed in making a good GaN on a GaAs substrate wafer. Then, the GaN growth on GaAs had been deemed to be entirely impracticable.

Only GaN/sapphire survives now as a GaN device. Thus, one way of improvement is directed to sophistication of the sapphire substrate method. It is said that GaN/sapphire LEDs have a long lifetime despite the high density defects. However, if the defects were reduced, the lifetime of GaN LEDs would be prolonged further. Besides, GaN LDs don't have a long lifetime enough for practical use. Trials have been made for growing a GaN crystal of lower defect density on a sapphire substrate.

⑤ Journal of Electrons, Information and Communication Society C-II, vol.J81-C-II,p58–64. This report suggested a stripe mask growing method comprising the steps of covering a sapphire substrate with a striped mask and growing a GaN crystal on the masked sapphire. Plenty of isolated GaN films grow on the sapphire within the windows of the striped mask. The isolated GaN films overflow on the mask for growing in the horizontal directions, come in contact with each other and unite into a GaN film. ⑤ asserted that the striped mask growth succeeded in reducing the defect density in the GaN film to the great extent. If the defects are truly decreased, the striped mask growth would give an improvement to the GaN/sapphire LEDs. However, the striped mask growth ⑤ adheres to sapphire as a substrate. The GaN-type LEDs are accompanied by the sapphire substrates. The improved GaN-LEDs are still suffering from the problem of non-cleavage. Dicing the GaN/sapphire wafer into LED chips would be still a difficult process of a low yield due to the non-cleavage of the sapphire substrate. The accompanying sapphire would introduce many microcracks and dislocations in the GaN single crystal on the sapphire owing to the difference of the thermal expansion coefficients. The sapphire substrate would still have a large distortion. The distortion would impede the wafer processes by the lithography.

The problem of the differences of the thermal expansion and the lattice constants is inherent in the use of the foreign material substrate. The most desirable substrate for GaN-LEDs is a GaN substrate. However, wide GaN single crystals cannot be produced yet at present. A suitable diameter of the wafer for the wafer process is more than one inch, preferably, more than two inches. But, such a large sized GaN wafer does not exist.

Czochralski method and Bridgman method are well-known crystal growth methods which can grow large-sized crystals. Both the methods prepare a material melt by heating solid material, bring a seed crystal in contact with the material melt and solidify a part of the melt from the seed. The reason why both methods can make large single crystals is that the methods solidify a material melt into a single crystal. These methods are impotent for a material which does not take liquid phase by heating. Heating cannot melt GaN solid. The solid GaN is sublimed into vapor GaN by heating. The lack of the liquid phase of GaN inhibits Czochralski or Bridgman method from producing large GaN single crystals. Instead of GaN melt, a Ga-GaN complex melt can be prepared by adding a little amount of GaN to a Ga solvent and by heating the GaN containing Ga solvent under ultrahigh pressure of several tens of thousands atm. The space maintaining the ultrahigh pressure, however, is too narrow. The ultrahigh pressure apparatus can make only a very small GaN crystal which is improper to a substrate crystal. Since the ordinary crystal growth techniques could not be applied to GaN, there is no large GaN substrate crystal.

GaN thin films can be made by film growth methods which utilize a phase transition from vapor phase to solid phase. GaN films are deposited upon a sapphire substrate by the following four film growth methods.
1. HVPE method (Halide Vapor Phase Epitaxy)
2. MOC method (Metallorganic Chloride Method)
3. MOCVD method (Metallorganic Chemical Vapor Deposition)
4. Sublimation method The MOC method piles a GaN film on a substrate by making a Ga-metallorganic compound (e.g., trimethyl gallium) react with hydrochloric gas (HCl) in a hot-wall type furnace for producing gallium chloride (GaCl), making the GaCl react with ammonia ($NH_3$) supplied to a substrate and piling the GaN film on the heated substrate. In practice, the metallorganic compound gas and HCl gas are transported in a form of a mixture with hydrogen gas ($H_2$) as a carrier gas. Since the MOC makes use of metallorganic compound as a Ga material, carbon (C) atoms are included in the GaN film as an undesirable impurity. The impurity carbon colors the GaN film with yellow. It is difficult to make a transparent, colorless GaN film due to the impurity. carbon. Furthermore, the carbon atoms increase the carrier concentration (free electron concentration) and reduce the electron mobility. Namely, the impurity carbon degrades the electronic property of the GaN film besides the optical property. These are the drawbacks of the MOC method.

The MOCVD is the most prevalent method for making GaN films. The MOCVD supplies a Ga metallorganic compound (e.g., TMG) with hydrogen gas and $NH_3$ gas with hydrogen gas to a heated substrate in a cold-wall type furnace for inducing the reaction of the TMG with $NH_3$ and piles a GaN film on the heated substrate. The MOCVD method has an economical weak point of low yield, since a great amount of gases are utilized in the MOCVD. When a thin film, e.g., an activation layer is formed, the poor efficiency may be negligible. But when the object is a production of a thick substrate crystal, the low efficiency of gases would be a fatal drawback. Besides the inefficient gas consumption, the MOCVD is also suffering from the carbon inclusion from the metallorganic compound. The GaN film is colored to be yellowish by the impurity carbon. The electronic property is degraded by the included carbon atoms through an increase of n-type carriers and a decrease of electron mobility.

The HVPE method employs metal Ga as a Ga material unlike the MOCVD or the MOC. This method prepares a Ga pot having metal Ga in a hot wall type furnace. Since the melting point of Ga is very low, the metal Ga becomes a Ga melt above 30° C. A supply of hydrochloric gas plus hydrogen gas (HCl+$H_2$) to the Ga melt produces gallium chloride (GaCl) gas as an intermediate compound. The carrier gas $H_2$ conveys the GaCl gas to the heated sapphire substrate. The GaCl reacts with ammonia ($NH_3$) gas for making gallium nitride (GaN). The GaN piles on the heated sapphire as a GaN thin film. The HVPE makes use of metal Ga which contains no carbon. The materials of the HVPE are free from carbon. The GaN film on the sapphire is immune from carbon. Since the GaN is not polluted with carbon, the GaN film is colorless and transparent. The colorless GaN enjoys high electron mobility. The GaN film has a good property.

GaN-type devices have been heteroepitaxially grown on sapphire single crystal substrates, since there is no technique of making a wide bulk GaN single crystal substrate. The most appropriate substrate for GaN-type devices, however, is still a GaN single crystal substrate. One purpose of the present invention is to provide a wide, bulk GaN single crystal substrate which can be a substrate wafer for making GaN-type devices. Another purpose of the present invention is to provide a distortion-free GaN bulk single crystal substrate. Another purpose of the present invention is to provide a transparent GaN bulk single crystal substrate immune from carbon. A further purpose of the present invention is to provide a method of making a wide bulk single crystal of GaN. Another purpose of the present invention is to provide a low cost method of making GaN bulk single crystal wafers.

SUMMARY OF THE INVENTION

This invention proposes a method for producing a freestanding GaN single crystal substrate by the steps of preparing a (111) GaAs single crystal substrate, forming a mask having periodically arranged windows on the (111) GaAs substrate, making thin GaN buffer layers on the GaAs substrate in the windows of the mask at a low temperature, growing a GaN epitaxial layer on the buffer layers and the mask by an HVPE or an MOC at a high temperature, eliminating the GaAs substrate and the mask away and obtaining a freestanding GaN single crystal substrate. This is a method of making a single GaN wafer. The GaN single crystal wafer has a diameter larger than 20 mm and a thickness more than 0.07 mm, being freestanding and substantially distortion-free.

This invention propose a further method of making a long GaN single crystal ingot by an additional step of piling a thick GaN layer homoepitaxially upon the GaN wafer made by the previous process as a seed. The GaN ingot should have at least a 10 mm thickness. A plurality of GaN wafers can be obtained by slicing or cleaving the GaN ingot into thin GaN substrate wafers.

The GaAs substrate can be eliminated by etching the GaN/GaAs complex crystal with aqua-regina. One surface or both surfaces of the GaN wafer should be polished for making a GaN mirror wafer. This invention diverts the GaN film-production method (epitaxy) to GaN wafer-production or GaN ingot-production method by combining the epitaxy with the lateral growth.

Large size is the conspicuous feature of the GaN wafer made by the present invention. The GaN wafer of the present invention is bigger than 20 mm in a side in the case of a square wafer. A diameter should be longer than 25 mm (1 inch) in the case of a round wafer. A preferable round GaN wafer has a diameter wider than 2 inches (50 mm) for making LEDs or LDs at low cost. A wide GaN wafer can be produced by adopting a wide GaAs wafer as a starting substrate.

The GaN wafer has a thickness enough to be freestanding and to be convenient for handling in the wafer process. 50 $\mu$m to 1 mm is suitable for the thickness of the GaN wafer of the present invention. A thin wafer of a thickness less than 50 $\mu$m cannot maintain the own shape. A thick GaN wafer thicker than 1 mm would raise the cost. A preferable range of the GaN thickness is between 70 $\mu$m and 1 mm.

The GaN substrates made by the method of the present invention are distorted. Intrinsic internal stress distorts the GaN substrates. Distortion is nuisance for the wafer process of making devices. The distortion should be suppressed. The most important problem for the method of making GaN films is reduction of the distortion of substrate crystals. This invention proposes an improvement of the growing process and polishing of the wafers.

(1) Improvement of the growing process lateral . . . growth utilizing a mask having windows.
(2) Polishing . . . As long as a wafer has an enough thickness, the distorted wafer can be a flat wafer by polishing the curved surface.
(3) Surface polishing . . . When the distortion is removed forcibly by polishing the curved wafer, the surface orientation deviates from the determined crystal orientation. The error of the orientation should be corrected by surface polishing. This invention investigates the deviation of the crystal orientation from the surface orientation and clarifies the desirable deviation of the crystal orientation on the surface.

This invention chooses the HVPE method for making a GaN single crystal. The reason why the HVPE is selected is that the HVPE keeps the GaN free from carbon contamination. The MOC method or the MOCVD method allows carbon to invade into growing GaN crystals. Since the GaN crystals are immune from carbon, the GaN of the invention is not colored yellowish but is transparent and colorless. Since the GaN contains no carbon, the GaN has a high electron mobility. Exclusion of carbon enhances the transparency. When the GaN crystal is put on a page of a book, one can clearly see the characters or figures on the page via the GaN crystal like a window glass.

Although the material gas contains no As, As atoms subliming from the GaAs substrate sometimes invade into the GaN as an impurity. The impurity As colors the GaN yellowish, brownish or grayish. However, the inclusion of As is very little, since the mask and the buffer layers protect the GaN from the As pollution. Included As would perturb the lattice structure of GaN and would degrade the performance of the LEDs which are made from the GaN contaminated by As. But the GaN made by the HVPE is immune from such anxiety. The HVPE can suppress the As inclusion below $10^{17}$ cm$^{-3}$.

The present invention provides a wide GaN single crystal wafer. The GaN wafer of the present invention is nearly immune from defects such as dislocations since the GaN is made by the lateral growth method using a mask having windows. Since a thick GaN ingot is piled upon the substrate by the HVPE method without using carbon compounds, the present invention makes a GaN wafer with high transparency. The lateral growth reduces the internal stress and decreases the distortion of the wafer. The distortion is further reduced by polishing the surface of the wafer. The nearly distortion-free wafer can be utilized for the wafer process like photolithography. The fluctuation of the crystal planes is within the practical tolerances. Thus, the GaN wafer of the present invention can be used for the substrate of GaN LEDs and LDs. Since the materials of the film and the substrate are the same, the GaN wafer is nearly distortion-free, and the internal stress is also small. Therefore, the dislocation density is small, and the emission efficiency is raised. GaN-LEDs and GaN-LDs enjoy a long life time.

BRIEF DESCRIPTION OF THE DRAWINGS

FIG. 6 (1) is a sectional view of a GaAs(111) substrate covered with a mask having windows as an early step of the process for making a freestanding GaN substrate.

FIG. 6 (2) is a sectional view of the GaAs (111) substrate covered with a mask having the windows as an intermediate step of the process for making a freestanding GaN substrate, the windows being half filled with GaN buffer layers.

FIG. 6 (3) is a sectional view of an epitaxial GaN layer piled on both the buffer layers and the mask formed upon the GaAs substrate as a later step of the process for making a freestanding GaN substrate.

FIG. 6 (4) is a sectional view of a GaN freestanding crystal substrate separated from the GaAs substrate and the mask by etching and polishing as the last step of the process for making a freestanding GaN substrate.

FIG. 7 (1) is a front view of a GaN ingot grown on a GaN seed as an early step of the process of making wafers by producing a GaN ingot by piling GaN on the GaN seed and cutting the GaN ingot into a plurality of wafers.

FIG. 7 (2) is a front view of the GaN ingot sustained by a supporter and sliced by an inner blade slicer into a plurality of wafers as an intermediate step of the process of making wafers by producing a GaN ingot by piling GaN on the GaN seed and cutting the GaN ingot into a plurality of wafers.

FIG. 7 (3) is a plan view of a GaN wafer as the last step of the process of making wafers by producing a GaN ingot by piling GaN on the GaN seed and cutting the GaN ingot into a plurality of wafers.

FIG. 15(a) is an explanatory figure of a deformed GaN wafer for showing the definitions of a normal (dotted arrow) on the substrate surface and a normal (solid arrow) on the crystal plane. The normals on parts of the surface coincide with the normals on crystal planes in the deformed state in an exemplar as-cut wafer.

FIG. 15(b) is an explanatory figure of a polished GaN wafer for showing the definitions of a normal (dotted arrow) on the substrate surface and a normal (solid arrow) on the crystal plane. The normals (solid arrows) on crystal planes deviate from the normal (dotted arrows) on the surface in the polished state.

FIG. 15(c) is an explanatory figure of a polished GaN wafer for showing the definition of the fluctuation of the normals (solid arrows) on the crystal planes on the whole surface. A normal (q) on a crystal plane surface inclines to the left. Another normal (u) on another crystal plane inclines to the right. The inclining angles of the normals vary on the surface. The fluctuation of the inclination angles is defined as the fluctuation of the normals on planes.

FIG. 16 is a graph for showing the relation between the distortion angel Θ (degree) and the distortion radius (mm) for distorted 2-inch diameter wafers.

DETAILED DESCRIPTION OF THE PREFERRED EMBODIMENTS

This invention starts not from a sapphire substrate but from a GaAs substrate for making GaN. There is no means for eliminating only the sapphire substrate. The GaAs substrate can be eliminated from GaN by aqua-regia. As mentioned before, many attempts had failed in making GaN crystals on GaAs substrates in 1970's. The GaAs substrates for GaN growth had been abandoned as a forlorn stalemate. Why do the Inventors now employ the once forlorn technique again? Sudden revival of GaAs as a substrate originates from Inventors' recent discovery of the lateral growth method which exhibits an excellent effect on growing thin films. The lateral growth method covers a GaAs substrate with a mask, perforates periodic windows in the mask to the undercoat GaAs and grows GaN on the revealed undercoat GaAs in the windows of the mask. The lateral growth method resurrects the once abandoned GaAs substrate. The new technique inspires the forlorn GaAs substrate with a new life. The lateral growth has been described by Japanese Patent Application No.10-078333 by the Inventors.

Gallium nitride (GaN) belongs to the hexagonal symmetry group. GaN(0001) plane has six-fold rotation symmetry. GaAs belongs to the cubic symmetry group unlike GaN.

GaAs(100) plane or GaAs(110) plane does not have three-fold rotation symmetry. Then, GaAs(111)A-plane or GaAs (111)B-plane is used as a substrate for GaN, since GaAs (111)A or GaAs(111)B has three-fold rotation symmetry. GaAs(111) has two different sets of planes. One has only Ga atoms. It is called GaAs(111)A-plane. The other has only As atoms. It is called GaAs(111)B-plane.

Figure 1:
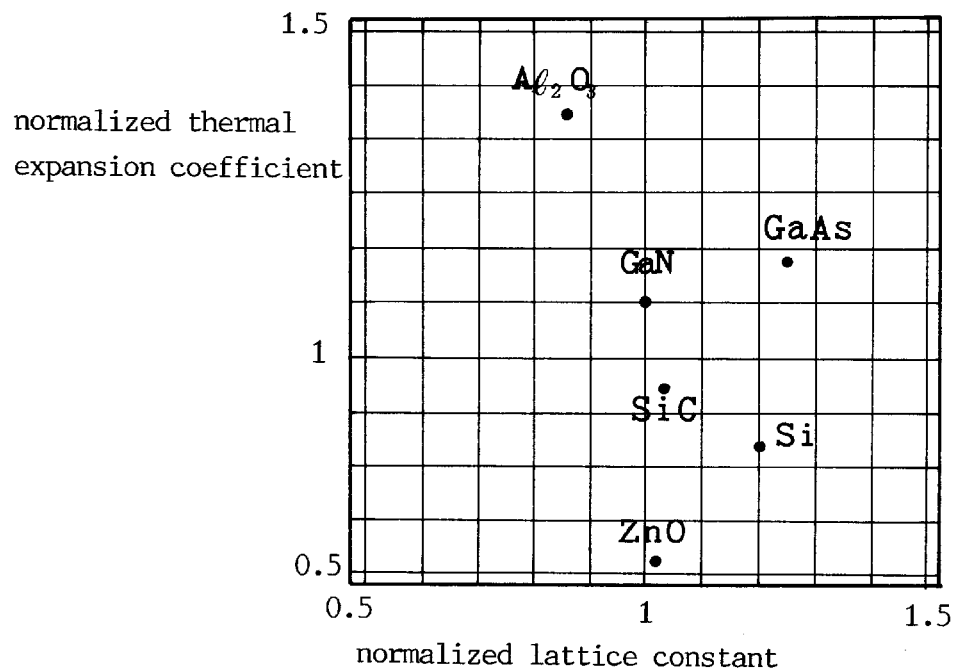
FIG. 1 is a graph showing GaN-normalized thermal expansion coefficients and GaN-normalized lattice constants of candidates $Al_2O_3$, GaAs, SiC, Si and ZnO for the substrate for growing GaN.
Figure 2:
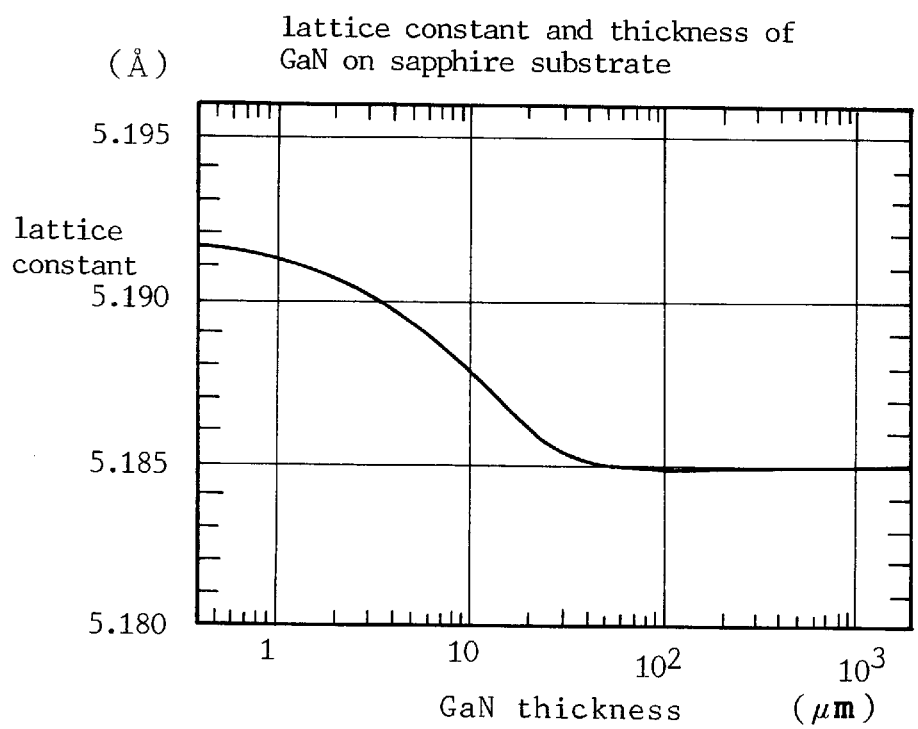
FIG. 2 is a graph showing the change of the lattice constant of GaN on sapphire as a function of the GaN thickness.
Figure 3:
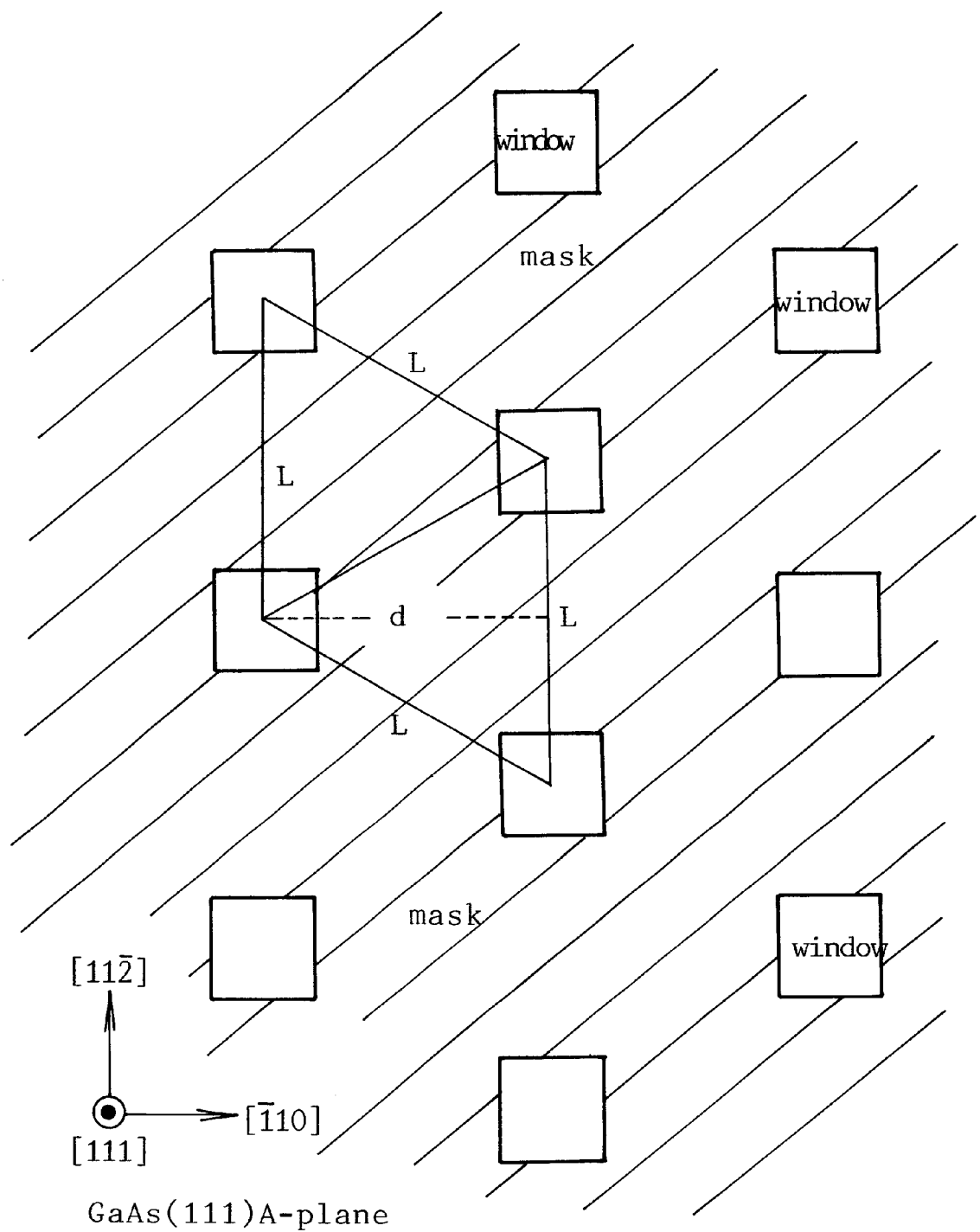
FIG. 3 is a plan view of a dot patterned window mask deposited upon a GaAs (111)A-plane substrate.
Figure 5:
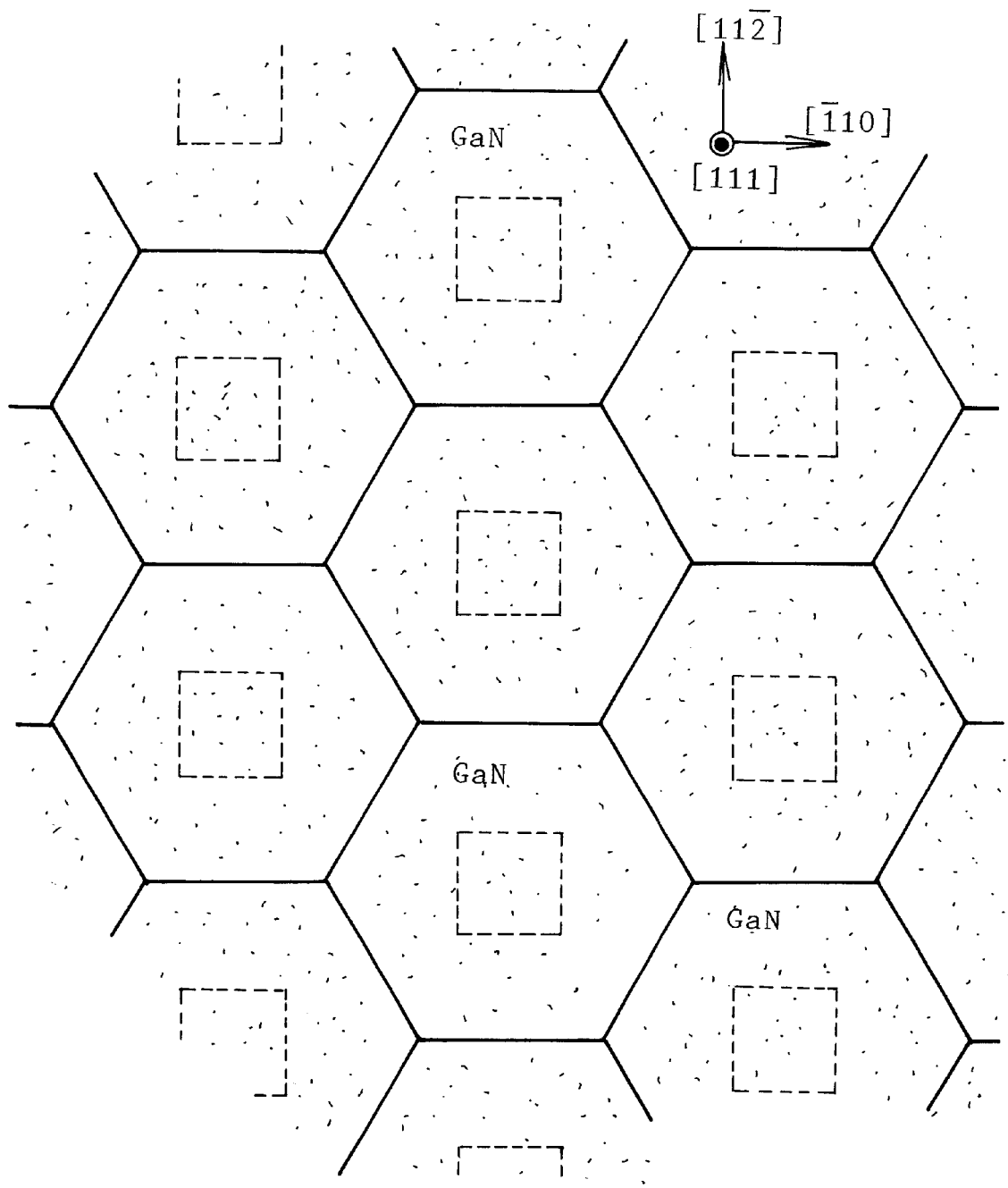
FIG. 5 is a plan view of a state in which neighboring GaN films come in contact with each other in regular hexagons upon the mask.

The lateral growing method utilizes a mask having periodically aligned windows. A dotted window type mask or a striped window type mask will be employed for growing GaN. FIG. 3 shows a dotted window type mask for the lateral growth. $Si_3N_4$ and $SiO_2$ are suitable for the material of the mask, since $Si_3N_4$ and SiO2 expel GaN nuclei. The thickness of the mask is 100 nm to 1 μm. The mask has periodic windows. In the example, the window is a fine square. Instead of a square, a round, a triangle, an ellipse and a hexagon are also available for the shape of the window. The alignment is important for the mask. Windows align at a spatial period (L) in line in the direction of GaAs[11-2]. Each line of the windows is distanced from the neighboring lines in the direction GaAs[-110] by d. The preferable distance is $d=3^{1/2}L/2$. The windows are displaced by a half period (L/2) from the neighboring lines. The best mask arranges the windows at apexes of equivalent triangles having a [11-2] side and covering the surface without margin. For example, the window is a square of 2 μm×2 μm, the period is L=6 μm and the distance is d=5 μm. The excellence of such a dotted window mask results from the simultaneous contact for all the neighboring GaN films, as shown in FIG. 5. However, another arrangement of windows is also available. The mask having isolated dotted windows is called a "dotted window" type mask.

A "striped window" type mask having parallel windows and parallel mask stripes in turn also can grow GaN on a GaAs substrate. The striped window type mask has a strong point of faster growth than the dotted window type mask. But the striped window type mask has a drawback of larger distortion and higher defect density than the dotted window type mask.

The function of the lateral growth method is explained. Since GaN does not adhere to the mask, GaN crystal grains come into contact with the undercoat GaAs only within the windows. Isolated GaN grains grow freely in their own windows without interfering with other GaN grains. Till the individual GaN gains come into contact with each other upon the mask, nothing hinders the horizontal growth of the individual grains. The isolation of GaN grains at early stage suppresses the occurrence of the internal stress. The lack of the internal stress reduces the appearance of defects. The contact area between GaN and GaAs is restricted to a small area by the mask. The small contact area reduces the thermal stress which happens from the high temperature growth. The mask has a function of reducing both the intrinsic internal stress and the thermal stress.

The dotted mask is prepared by coating a GaAs substrate with the mask material ($Si_3N_4$ or $SiO_2$) and perforating windows by photolithography. FIG. 6(1) shows the GaAs substrate covered with the mask having windows.

Thin GaN buffer layers of about 10 nm to 100 nm are grown at a lower temperature of about 450° C. to 500° C. on the revealed GaAs surface by the HVPE method. The GaN buffer layers thinner than the mask are isolated within the windows by the mask, as shown in FIG. 6(2).

Figure 4:
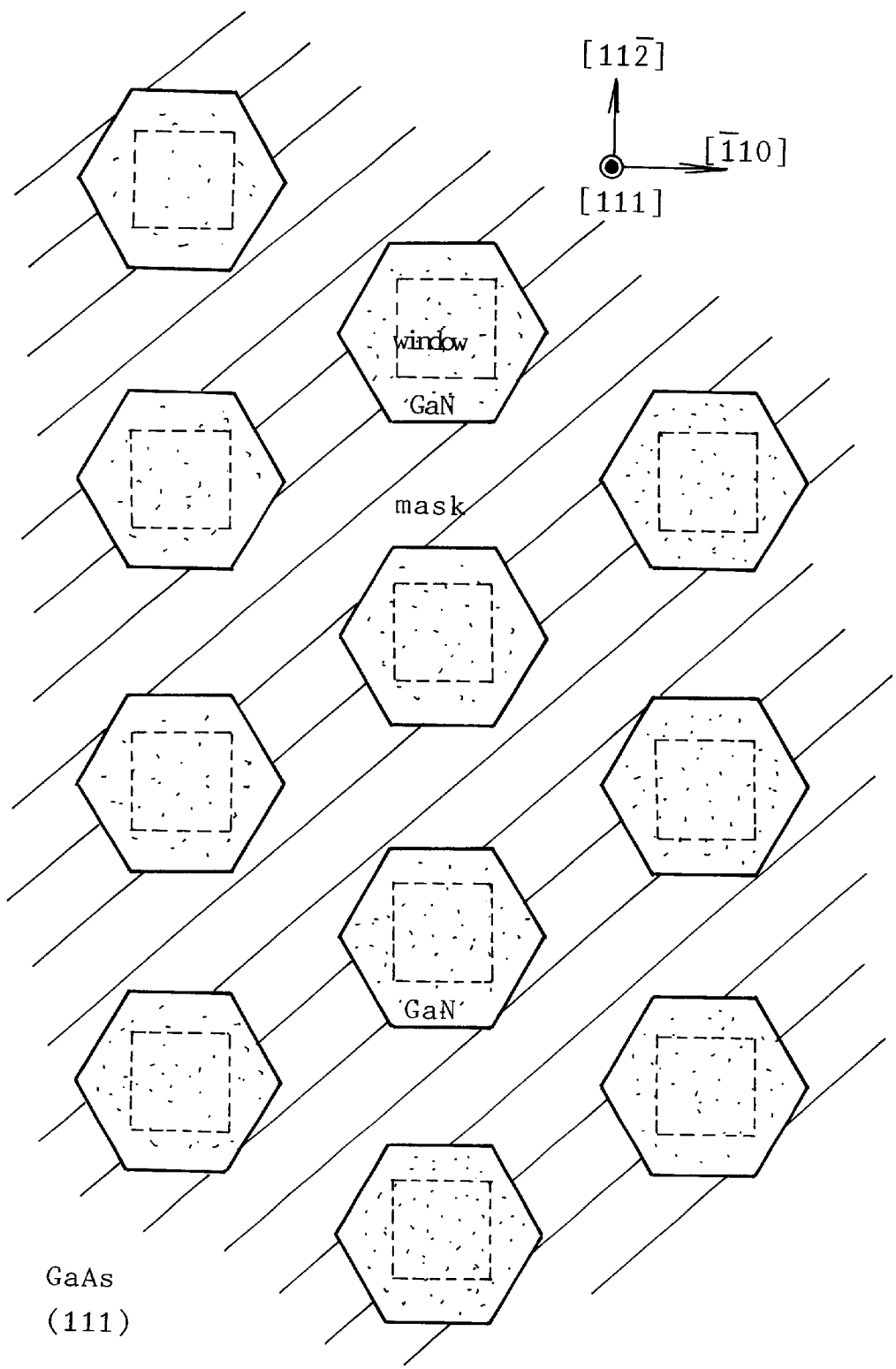
FIG. 4 is a plan view of a state in which isolated GaN films extend from the windows over the mask in regular hexagons.

The GaAs wafer is heated up to a higher temperature between 800° C. and 1050° C. An epitaxial GaN layer is further grown on the buffer layer and the mask. The buffer layers are crystallized from the amorphous state. The individual GaN grains growing from GaN nuclei borne in the isolated windows form hexagonal cones on the mask, as shown in FIG. 4. Maintaining the hexagonal cones, the GaN grains develop on the mask till the fronts of the cones come into contact with the fronts of the neighboring grains (FIG. 5). Then, the GaN layer grows upward. The object thickness of the GaN epitaxial layer is determined by the thickness of the desirable GaN wafer. A single wafer should have a thickness between 70 μm and 1 mm. The thickness of the GaN epitaxial layer should be determined to be 70 μm to 1 mm. The as-grown GaN epitaxial layer has a rough, opaque surface like frosted glass. Polishing is required for endowing transparency to the GaN crystal.

The GaAs substrate is eliminated by etching with aqua-regina. The mask is removed by polishing. An isolated GaN wafer is obtained, as shown in FIG. 6(4). The GaN wafer is freestanding and transparent. The above is the whole steps of making a single GaN wafer.

Extra steps are required for making a plurality of GaN wafers at a stretch. A thick epitaxial GaN crystal is grown upon the GaN wafer just made by the above process as a seed by the HVPE method. FIG. 7(1) shows the GaN crystal ingot made by the GaN/GaN growth. This is a cylindrical GaN single crystal ingot having a length (thickness) more than 10 mm. FIG. 7(2) shows the step of slicing the ingot sustained on a supporter into a plurality of as-cut wafers by an inner blade slicer. FIG. 7(3) shows a transparent and smooth GaN mirror wafer made by polishing the as-cut wafer. In this case, there is no probability of As inclusion. The GaN wafers are free from As.

Figure 8:
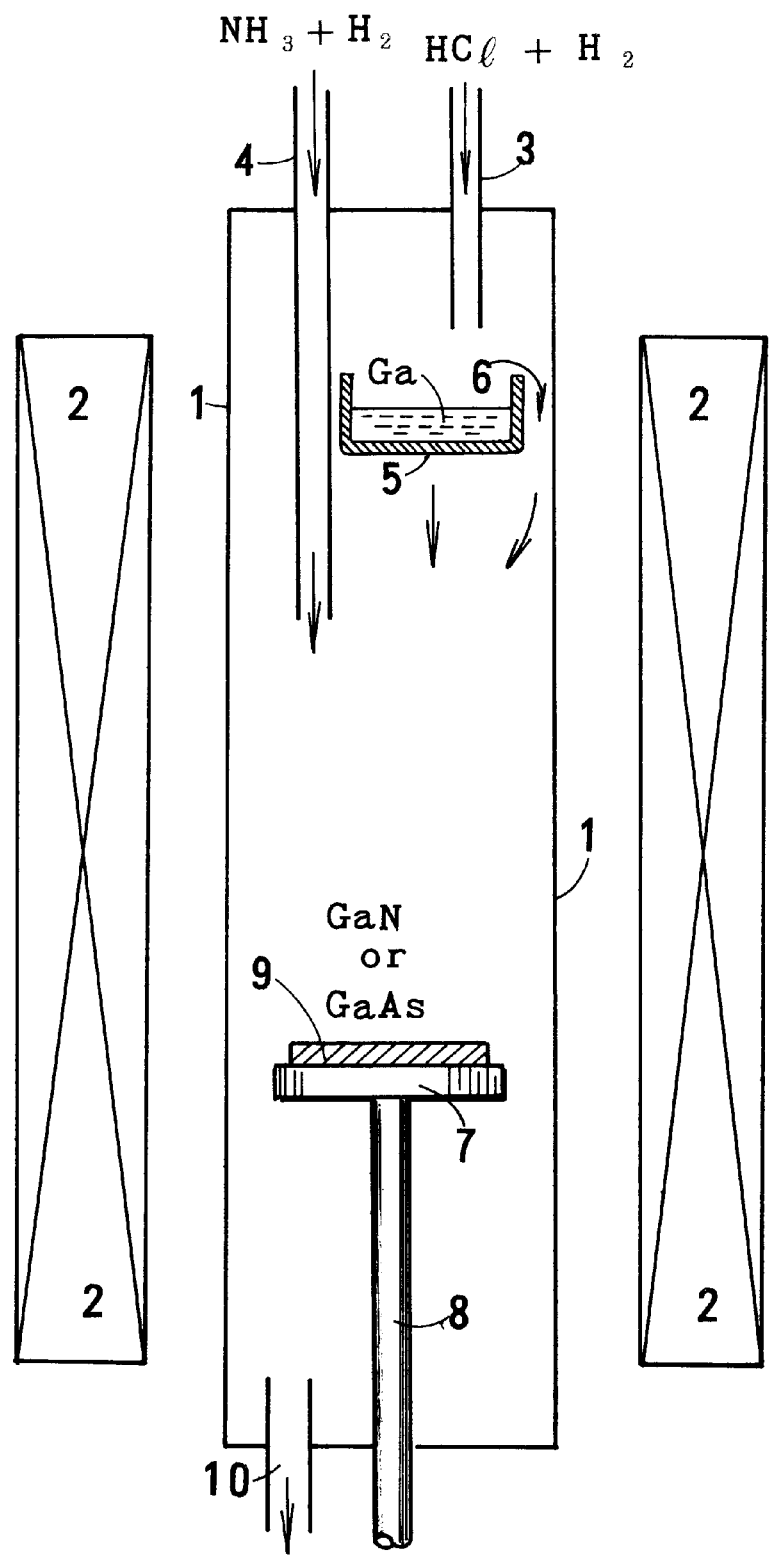
FIG. 8 is a vertically sectioned view of an HVPE (halide vapor phase epitaxy) apparatus.

FIG. 8 is the section of an HVPE apparatus for growing GaN on a GaAs substrate or a GaN substrate in the present invention. A vertically long reaction furnace 1 is surrounded by cylindrical heaters 2. The top of the furnace 1 has material gas inlets 3 and 4. The shorter material gas inlet 3 guides a mixture ($HCl+H_2$), where HCl is a reactive gas and $H_2$ is a carrier gas. A Ga-boat 5 is sustained below the end of the material gas inlet 3. Ga melt 6 is stored in the Ga-boat 5. Since Ga has a very low melting point, the heat of the furnace converts the Ga metal to the Ga melt 6. Ga vapor is floating above the Ga boat 5. The Ga partial pressure is an important factor ruling the GaN growth. Entering the furnace via the inlet 3 above the Ga melt 6, HCl gas induces the reaction Ga+HCl→GaCl+ . . . and makes gallium chloride (GaCl) as an intermediate compound. The carrier gas $H_2$ transports GaCl from the Ga boat 5 down to a susceptor 7. The longer material gas inlet 4 introduces a mixture ($NH_3$+ $H_2$) into the furnace 1 above the susceptor 7. $NH_3$ and GaCl make GaN by the reaction $GaCl+NH_3$→GaN+ . . . in the vicinity of the susceptor 7.

The susceptor 7 is supported at the top of a rotary shaft 8. The rotary shaft 8 can rotate and move up and down. Either a GaAs substrate or a GaN substrate 9 occupies the top of the susceptor 7. The substrate 9 is heated at a suitable temperature. GaN produced by the vapor phase reaction is piled on the substrate 9 (GaAs or GaN). Exhaustion gas is exhaled via a gas outlet 10 to a vacuum pump (not shown). The HVPE is characterized by the use of metal Ga and the intermediary of GaCl.

Vapor phase epitaxy requires vaporized materials. There is no vapor material including Ga at room temperature. Ga metal is a melt above 30° C. The MOC and the MOCVD utilize metallorganic compound as a Ga material, since metallorganic compound can be vaporized by bubbling with $H_2$. The metallorganic compound (e.g. trimethyl gallium)

includes carbon. The carbon is included in GaN as an impurity. The impurity carbon degrades the GaN made by the MOC and the MOCVD. Unlike the MOCVD or the MOC, the HVPE uses Ga melt itself prepared by heating Ga metal. The Ga melt produces Ga vapor. The HVPE makes HCl react with Ga vapor, produces an intermediate compound GaCl and makes GaCl react with $NH_3$. The HVPE is free from carbon due to the non-use of metallorganic Ga. This is the strong point of the HVPE.

The GaN substrate crystal made by the present invention shows n-type conduction, although it is not intentionally doped. The carrier density is about $1 \times 10^{16}$ cm$^{-3}$. The inventors investigated the reason of giving the GaN n-type conduction, and found the fact that what gives the n-type conduction is oxygen atoms included in the GaN. Oxygen atoms are included in the material gas as an impurity. The impurity oxygen gives the n-type conduction to the GaN. The Inventors further succeeded in controlling the carrier (electron) density within a range between $1 \times 10^{16}$ cm$^{-3}$ and $1 \times 10^{20}$ cm$^{-3}$ by using ultra-pure materials and regulating the oxygen partial pressure rigorously. The electron mobility can be controlled within a range from 80 cm$^2$/Vs to 800 cm$^2$/Vs by regulating the oxygen partial pressure. The resistivity can be also controlled in a range between $1 \times 10^{-4}$ $\Omega$cm and $1 \times 10$ $\Omega$cm by regulating the oxygen partial pressure. Otherwise, when low-purity materials are used and oxygen pressure is not regulated, non-doped GaN is suffering from high carrier density and low mobility. Thus, the use of ultrahigh pure materials and the oxygen pressure control are important. The carrier density can be varied also by other growth conditions. Preferable range is from $5 \times 10^{17}$ cm$^{-3}$ to $10^{19}$ cm$^{-3}$ for the carrier density. Preferable range of the resisitivity is from $1 \times 10^{-4}$ $\Omega$cm to $5 \times 10^{-2}$ $\Omega$cm.

The GaN substrate made by the present invention is endowed with excellent properties of large area, freestanding wafer, transparency and colorlessness. Sometimes the growing condition slightly colors the GaN yellowish, brownish or grayish. Low light absorption is required for the applications to optoelectronic devices. The colorless transparency is important for the substrates of optoelectronic devices. Lambert-Beer law ruling the transparency of a substrate is given by $$I = I_o \exp(-\alpha x),$$

where $I_o$ is the intensity of the incident light, I is the intensity of the output light, $\alpha$ is the absorption coefficient and x is the thickness of the object substrate. Smaller $\alpha$ means higher transparency. The GaN substrate produced by the present invention exhibits low $\alpha$ for the wavelength between 400 nm and 600 nm. The GaN crystal enjoys high transparency for the light. The GaN is polished on both surfaces. $\alpha$ is measured for the polished GaN substrate. The GaN made by the present invention has an absorption coefficient $\alpha$ lower than 120 cm$^{-1}$. This invention can make a GaN substrate of $\alpha < 80$ cm$^{-1}$. Small $\alpha$ is one of the requirements for the substrates for optoelectronic devices. Another serious problem is the distortion and the internal stress. Internal stress distorts the GaN substrate. Large distortion prohibits photolithography or other wafer process from making devices on the GaN substrate.

Figure 9:
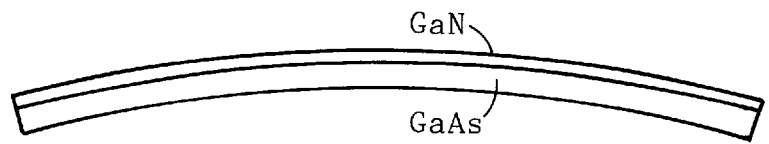
FIG. 9 is a section of a GaN/GaAs complex substrate in a distorted state bent by the thermal stress.

The internal stress results from the difference of thermal expansion coefficient between GaN and GaAs. The GaN is made on a heated GaAs substrate and is cooled to room temperature in the apparatus. Since the thermal expansion coefficients are different, the cooling invites distortion and internal stress in the GaN/GaAs complex substrate. FIG. 9 shows the distorted GaN/GaAs substrate. The GaN has internal stress in a direction. The GaAs has also internal stress in the inverse direction. There are two kinds of internal stress. One is intrinsic stress. The other is thermal stress. A change of temperature originates thermal stress at an interface between different materials.

Figure 10:
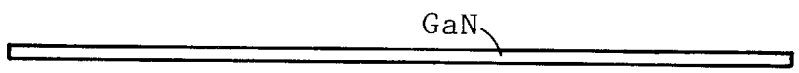
FIG. 10 is an explanatory figure of a flat GaN for explaining the fact that if the GaN crystal is fully free from intrinsic internal stress, the GaN would recover the flat shape after removing the GaAs substrate.
Figure 11:
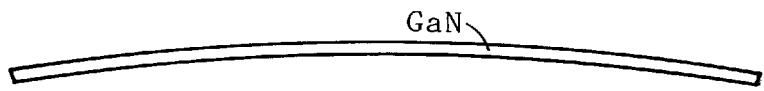
FIG. 11 is an explanatory figure of a bent GaN for explaining the fact that if the GaN crystal has intrinsic internal stress, the GaN would bend after removing the GaAs substrate.

If the GaN/GaAs substrate contains only thermal stress, the stress would vanish, when the GaAs is eliminated. The GaN would be flat, as shown in FIG. 10. But the isolated GaN is still distorted in general, as shown in FIG. 11. The permanent distortion is caused by intrinsic stress. The distortion results from the difference of stress between the top surface and the bottom surface and the gradient of the stress in the direction of thickness.

Large intrinsic stress was another reason why all the attempts of making GaN on GaAs had failed in 1970's. Strong internal stress including thermal one and intrinsic one induced plenty of defects, microcracks in GaN and break of GaN. The contrivance for reducing the intrinsic stress is the above-mentioned lateral growth method making the best use of the mask having windows. Intrinsic stress is raised partly by dislocations. The lateral growth method protects GaN by the mask from transcribing the dislocations in the GaAs substrate. The GaN is nearly free from the dislocations. Suppression of the transcription of dislocations decreases the intrinsic stress in the GaN.

Figure 12:
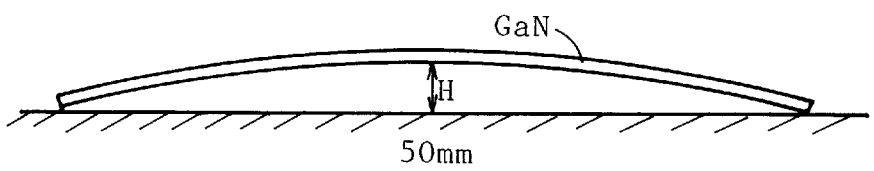
FIG. 12 shows the definition of the distortion of a wafer placed on a flat table. The height H of the center of a 50 mm diameter wafer is called a "distortion height". The angle of the edge of the wafer to the table is called a "distortion angle".

In spite of the reduction of defects, the isolated GaN still has some intrinsic stress which distorts the GaN wafer. Too large distortion forbids the photolithography. The measurement and the estimation of distortion are required. FIG. 12 demonstrates the definition and the measurement of distortion. An object wafer is put on an even table. The central part is separated from the table. The height H at the center is measured. The distortion height H should be reduced to 2-inch wafer for comparison. The edge inclination angle is called a distortion angle which is one of the parameters for describing the distortion.

The distortion has other parameters. Distortion curvature $\xi$ or distortion radius R can denote the distortion. $R = D^2/8H$ shows the relation between the distortion radius R and the distortion height H of FIG. 12. D is a diameter of the GaN wafer. For example, a 2-inch wafer gives D=50 mm. $\xi = 1/R = 8H/D^2$ is the relation between the distortion curvature $\xi$ and the distortion height H. The distortion angle $\Theta$ is given by a simple relation of $\Theta = 4H/D$.

Distortion is a measurable phenomenon. But stress is an inner potential which refuses direct measurement. When a disc with a film is distorted in a distortion height $\delta$, internal stress $\sigma$ is given by $$\sigma = \frac{Eb^2 \delta}{3(1-v)l^2 d}$$

where $\sigma$ is internal stress of the film on the disc, E is rigidity of the disc, v is Poisson's ratio of the disc, b is a thickness of the disc, d is a thickness of the film, l is a diameter of the disc and $\delta$ is the distortion height. When l=50 mm(2-inch), $\delta$=H(defined for 2-inch wafer). This is Stoney's equation for calculating the internal stress from the distortion. In the single GaN wafer, d=b.

$$\sigma = \frac{Ed\delta}{3(1-v)l^2}$$

Stoney's equation enabled us to calculate internal stress $\sigma$ from the distortion $\delta$. The internal stress can be interpreted as the force induced when the bent disc is forcibly flattened on the table. The relation among the distortion, the distortion radius and the internal stress is now explained. Larger internal stress increases the distortion but reduces the distortion radius for a constant thickness. Larger thickness decreases the distortion but enlarges the distortion radius for constant internal stress. The allowable ranges are estimated for distortion, distortion radius and internal stress in the GaN substrate by taking account of the facility of wafer process and the toughness of the wafer. The allowable ranges are;
1. distortion radius R . . . more than 600 mm ($\xi \leq 1.67 \times 10^{-3}$ mm$^{-1}$)
2. distortion height H (50 mm $\phi$) . . . less than 0.55 mm
3. internal stress $\sigma$. . . less than 7 MPa.

The requirements for the GaN wafer are R$\geq$600 mm, H$\leq$0.55 mm and $\sigma \leq$7 MPa. Preferably, $\sigma \leq$3 MPa and R$\geq$750 mm.

This invention includes a further method of making a thick GaN ingot by piling GaN further upon the GaN substrate made by the present invention as a seed. In the ingot production, an ingot longer than 10 mm is desirable for making more than ten wafers by slicing the ingot. Since the ingot is very thick, the distortion is small. The small distortion enables the slicer to cut the ingot with high preciseness. The large thickness accelerates the tendency toward low defect density by decreasing piercing dislocations. The wafers sliced from the ingot enjoy low defect density and small distortion.

FIG. 15($a$) shows a bent wafer having GaN crystal grains. Normals standing on crystal planes of low mirror index are denoted by solid line arrows. Normals standing on parts of the surface are designated by dotted line arrows. The normals/plane coincide with the normals/surface in FIG. 15($a$). The distortion can be further decreased by adding polishing step. Polishing is effective for reducing the distortion. When the surface is flattened by polishing, the orientations of crystal grains are left nearly untouched, as shown in FIG. 15($b$). The normals/planes (solid arrows) are left nearly untouched. The normals/surface (dotted arrows) are brought into parallel with each other. The normals/planes become different from the normals/surface at the peripheries by polishing.

The deviation between the normal/plane and the normal/surface is denoted by $\theta$. In the simple case of FIG. 15($b$), x denotes the distance from the center and L is a diameter. The deviation takes the maximum $\theta=\pm\Theta$ at x=$\pm$L/2. When the substrate is distorted in a radius R, the edge distortion angle $\Theta$ satisfies an equation 2R$\Theta$=D, where D is a diameter of the substrate. When $\Theta$ is represented by degrees, the same equation has another expression $\pi$R$\Theta$=90D. For 2-inch wafers (D=50 mm), $\Theta$=1432/R. FIG. 16 shows the relation between R and $\Theta$.

The relation of FIG. 16 holds only on a 2-inch wafer. Wafers of other than 2-inch can also be employed. In the cases, the distortion should be reduced in the case of 2-inch wafer. M-inch wafer has a similar expression of $\Theta$=716M/R. The reduction or normalization is easy. The followings are the restriction which are reduced to a 2-inch wafer.

In a 2-inch wafer, R should be larger than 600 mm. Namely, edge deviation angle $\Theta$ should be within $\pm$2 degrees. The deviation $\theta$ should be less than 4 degrees.

The tolerance of adjustment for polishing is $\pm$1 degrees. The condition R>600 mm gives $\pm$2 degrees. The total tolerance of the distortion angle $\theta$ is $\pm$3 degrees.

Polishing sometimes induces new distortion from intrinsic stress. The Inventors found that the distortion induced by polishing can be suppressed within 0.2 mm (2-inch wafer reduction). The relation R=D$^2$/8H gives the margin R=1563 mm for the distortion radius which corresponds to the critical height H=0.2 mm. Further, a suitable distortion height is less than 0.1 mm, which requires R>3125 mm.

[Embodiment 1 (HVPE, Lateral Growth, Production of a Single GaN Crystal Wafer]

Embodiment 1 makes a single GaN crystal wafer by the HVPE lateral growth. A GaAs (111) A wafer of a 30 mm diameter is set upon a susceptor in a plasma CVD reactor. A silicon nitride (Si$_3$N$_4$) film as a mask is grown upon the GaAs substrate to a thickness of 0.1 $\mu$m by the plasma CVD method. Three types of windows arranged in order are perforated in the mask by photolithography. One type windows are dotted windows. Another type windows are <11-2> striped windows. A third type windows are <1-10> striped windows.

1. dot patterned windows . . . FIG. 3 to FIG. 5 show this type of windows. Sets of windows align in GaAs<11-2> direction at an interval L. Neighboring sets are separated from each other by d=3$^{1/2}$L/2. The windows in the neighboring sets are displaced by half the interval in <11-2> direction. Namely, windows are positioned at apices of common equilateral triangles having a <11-2> side occupying the surface. The shape of the window is arbitrary. Square windows are shown in the example in FIG. 3, FIG. 4 and FIG. 5. Here, d=3.5 $\mu$m and L=4 $\mu$m.

2. <11-2> striped windows . . . A mask having sets of longitudinal windows and mask stripes parallel to GaAs<11-2> direction. The width of the stripe is 2 $\mu$m. The width of the window is also 2 $\mu$m. The pitch (spatial period) is 4 $\mu$m. This mask is not shown in figures.

3. <1-10> striped windows . . . A mask having sets of longitudinal windows and mask stripes parallel to GaAs<1-10> direction. The width of the stripe is 2 $\mu$m. The width of the window is 6 $\mu$m. The pitch (spatial period) is 8 $\mu$m. This mask is not shown in figures.

The samples are classified by the masks for the convenience of the following explanation. The samples having the dot patterned windows are called sample 1. The samples having the <11-2> striped windows are called sample 2. The samples of the <1-10> striped windows are called sample 3.

Sets of a GaN buffer layer and a GaN epitaxial layer are grown through the windows of the Si$_3$N$_4$ masks upon the GaAs substrate crystals.

(1) Formation of a GaN Buffer Layer (HVPE Method)

An HVPE apparatus having a Ga boat, a susceptor, a set of heaters, two gas inlets and gas exhaustion outlet (FIG. 8) is used for making buffer layers and epitaxial layers. The GaAs substrate wafer covered with the mask having the periodic windows is put on a susceptor in the HVPE apparatus. The HVPE apparatus is vacuumed by a vacuum pump. The masked GaAs substrate wafer is heated up to about 500° C. by the heaters. The Ga solid in the quartz boat is heated to a Ga melt up to above 850° C. by the heaters. A mixture of hydrogen gas (H$_2$) and hydrochloric (HCl) gas is supplied via a gas inlet to the Ga melt boat for making gallium chloride (GaCl) gas as an intermediate compound. A mixture of hydrogen gas (H$_2$) and ammonia gas (NH$_3$) is supplied via another gas inlet to the masked GaAs substrate heated at about 500° C. for synthesizing GaN by a chemical reaction of GaCl +NH$_3$→GaN+ . . . The GaN particles are piled on the revealed GaAs in the windows as a GaN film. The GaN buffer layers are piled to a thickness of about 70 nm in the windows on the masked GaAs wafer. The silicon nitride (Si$_3$N$_4$) mask has a function of suppressing the growth of GaN. Then, GaN film is not grown upon the Si$_3$N$_4$ mask. Since the GaN buffer layer (70 nm) is thinner than the $Si_3N_4$ mask (100 nm), plenty of independent GaN buffer layers are formed in the windows of the mask. Each buffer layer is isolated from neighboring ones by parts of the mask.

(2) Formation of an Epitaxial Layer (HVPE Method)

When the formation of the buffer layers has finished, the introduction of HCl gas (+$H_2$ gas) is stopped. Then, the temperature of the GaAs substrate is raised from 500° C. to about 1000°C. The HCl gas (with $H_2$) is again supplied to the Ga melt for making GaCl by the reaction of Ga+HCl→GaCl+ . . . The carrier gas $H_2$ conveys the GaCl gas downward to the GaAs wafer covered with the mask and the buffer layers. The reaction of ammonia gas ($NH_3$) with the GaCl makes GaN. The GaN crystal is grown as an epitaxial layer upon the buffer layers in the windows. When the top of each epitaxial layer grows above the top of the mask (100 nm), isolated GaN crystals expand from the windows on the mask in a shape of a regular hexagonal cone. FIG. 4 and FIG. 5 show the hexagonal cones of the GaN epitaxial films growing from the isolated windows onto the mask. Since the windows lie at apexes of equilateral triangles, the isolated GaN films growing in a hexagonal shape from the windows come into simultaneous contact on all the sides with neighboring ones. Because the growing speeds are equal, the neighboring hexagons of GaN films are brought into tight contact with each other without gap. When the GaN films are unified into an integrated GaN film on the mask, the GaN film grows upward. The growing speed is about 50 μm/H. A GaN epitaxial layer is grown to a thickness of about 100 μm by the HVPE method. The surface of the GaN epitaxial layer looks like opaque glass. This method making plenty of nuclei in windows and growing microcrystals from the nuclei independently within the windows of a mask is called a "lateral growth" method. The lateral growth method enables the grown crystals to reduce internal stress, since many crystals grow independently within the windows.

(3) Elimination of GaAs Substrate

The samples having a GaN/mask/GaAs structure are placed in an etching apparatus. The samples are etched by aqua-regina for about ten hours for eliminating the GaAs substrate completely. Both surfaces of the samples are polished to be GaN single crystals. The samples are all free-standing GaN wafers. These are the case of sample 1 using the dotted window mask. Similar GaN crystals are grown in a similar manner on the sample 2 GaAs substrate covered with the <11-2> lateral striped masks and on the sample 3 GaAs substrate covered with the <1-10> lateral striped masks. The GaN single crystals of samples 1 to 3 exhibit n-type conduction.

The carrier concentration, the electron mobility and the resistivity are measured. Table 1 shows the data of the carrier concentration, electron mobility and resistivity of the samples 1 to 3.

TABLE 1

Carrier concentration, electron mobility, resistivity of samples 1, 2 and 3 obtained from GaAs substrates with different masks of the dotted windows, the <11-2> striped windows and the <1-10> striped windows.

| Sample No. | mask windows | Carrier density ($cm^{-3}$) | Electron mobility ($cm^2$/V sec) | Resistivity (Ω cm) |
|---|---|---|---|---|
| sample 1 | dot patterned | $3 \times 10^{18}$ | 200 | $8.3 \times 10^{-3}$ |
| sample 2 | <11-2> striped | $6 \times 10^{18}$ | 150 | $6 \times 10^{-3}$ |
| sample 3 | <-110> striped | $1 \times 10^{19}$ | 120 | $3.5 \times 10^{-3}$ |

(4) Electric and Optical Properties

Although no dopant is doped intentionally, all the three type samples show n-type conduction. Enhancement of crystallography requires low carrier concentration, high electron mobility and high resistivity. The best one among the three types is sample 1 due to the highest mobility, the highest resistivity. The electric properties depend upon the conditions of growth. Samples 1 to 3 are brownish transparent. Bare optical absorption coefficients in a wavelength range between 400 nm and 600 nm is 40 $cm^{-1}$ to 80 $cm^{-1}$ without the correction of reflection. The residual As concentration in the GaN crystal is $9 \times 10^{16}$ $cm^{-3}$. This fact means that the GaAs has been completely removed by the etching.

(5) X-ray Diffraction Analysis

The angular relation between the orientation of the GaN surface and the orientation of the GAN(0001) plane is investigated by the X-ray diffraction apparatus. The X-ray diffraction teaches us that a normal on the GaN crystal surface inclines at 2.5 degrees to a normal on the GaN(0001) plane on the whole GaN surface. The fluctuation of normals on the GaN(0001) planes is 3.2 degrees on the whole GaN surface. The GaN crystals are polished. The distortion of the two GaN crystals after polishing is measured. When the distortion is measured on one-inch diameter wafer (25 mm), the heights H at the center of the wafers are H=25 μm and H=48 μm. The height H relates to the distortion curvature radius R by the equation $R=D^2/8H$, where D is a diameter of a wafer, R is a distortion radius and H is a height of a center of wafer. H=25 μm gives R=3125 mm. H=48 μm gives R=1628 mm. In general, the upper limit allowing the photolithography is H=0.2 mm for a 2-inch diameter wafer. This corresponds to R=1563 mm for curvature radius. The distortion of Embodiment 1 is less than the photolithography limit. The small distortion allows the photolithography to depict patterns on the GaN wafers of Embodiment 1.

[Embodiment 2 (Seed of HVPE, Lateral Growth, GaN Ingot of HVPE]

Embodiment 2 aims at making long GaN single crystal ingots from a GaN seed crystal. A GaAs (111) A wafer of a 2-inch diameter (50 mm) is set upon a susceptor in a plasma CVD reactor. A silicon oxide ($SiO_2$) film as a mask is grown upon the GaAs substrate to a thickness of 0.1 μm (100 nm) by the plasma CVD method. Dot patterned type windows shown in FIG. 3 are perforated in the mask by photolithography (like sample 1 of Embodiment 1). Here, d=3.5 μm and L=4 μm.

(1) Formation of a GaN Buffer Layer (HVPE Method)

An HVPE apparatus (FIG. 8) having a Ga boat, a susceptor, a set of heaters, two gas inlets and a gas exhaustion outlet is used for making buffer layers and epitaxial layers. The GaAs substrate wafer covered with the mask having dotted windows is put on the susceptor. The HVPE apparatus is vacuumed by a vacuum pump. The Ga solid in the quartz boat is heated to a Ga melt up to about 800° C. by the heaters. The masked GaAs substrate wafer is heated up to about 500° C. A mixture gas ($H_2$+HCl) is supplied via a gas inlet to the Ga melt boat for making gallium chloride (GaCl) gas. A mixture gas ($H_2$ +$NH_3$) is supplied via another gas inlet to the masked GaAs substrate of about 500° C. for synthesizing GaN by a chemical reaction of GaCl+ $NH_3$→GaN+ . . . The GaN particles are piled on the revealed GaAs in the windows as a GaN film. The GaN buffer layers are piled to a thickness of about 80 nm in the windows on the revealed GaAs surface. The silicon oxide ($SiO_2$) mask has a function of suppressing the growth of GaN. Then, GaN film is not grown upon the $SiO_2$ mask.

(2) Formation of an Epitaxial Layer (HVPE Method)

When the buffer layers has been formed, the supply of HCl gas (+$H_2$ gas) is stopped. Then, the GaAs substrate is heated from 500° C. up to about 1000° C. in the same HVPE apparatus. The HCl gas (with $H_2$) is again supplied to the Ga melt. The epitaxial layer is further piled to a thickness of 80 μm on the buffer layers and the mask by a similar way to Embodiment 1.

(3) Elimination of GaAs Substrate

The samples having a GaN/mask/GaAs structure are taken out of the HVPE apparatus. It is verified that a continual GaN crystal with a mirror plane is formed on the substrate. The GaN/mask/GaAs samples are placed in an etching apparatus for eliminating the GaAs substrate by aqua-regina completely.

(4) Production of Thick GaN Ingots From the GaN Seeds (HVPE Method)

The GaN crystal samples are washed. The samples are pure GaN freestanding wafer as shown in FIG. 6 (4). The GaN samples are still too thin. The GaN wafer is utilized as a seed. A thick GaN single crystal ingot is made by the HVPE from the seed. The GaN thin wafer is put on the susceptor in the HVPE apparatus of FIG. 8 and is heated up to 1020° C. A thick GaN crystal is further epitaxially grown on the GaN seed to an ingot, as shown in FIG. 7 (1). The GaN crystal is a cylindrical ingot having a small cavity at the center. The height of the lowest part is about 20 mm. The average diameter is about 55 mm.

(5) Cutting the GaN Ingot Into GaN Wafers by a Slicer

The GaN ingot sustained by a supporter is cut in the direction perpendicular to the axis by an inner blade slicer or an outer blade slicer into a plurality of GaN wafers, as shown in FIG. 7 (2). The 20 mm long ingot produces 20 GaN single crystal wafers of an about 50 mm outer diameter and a 350 μm thickness. The components of the GaN wafers are analyzed. The concentrations of arsenic (As) and carbon (C) are below the background level. This measurement verifies that the GaN wafers contain neither arsenic (As) nor carbon (C).

(6) Polishing

The GaN wafers are lapped and polished. Both surface or one surface is polished to be a mirror surface, as shown in FIG. 7 (3). All the polished wafers are nearly distortion-free. The wafers are transparent.

(7) X-ray Diffraction Analysis

The angular relation between the orientation of the GaN surface and the orientation of the GaN(0001) plane is investigated by the X-ray diffraction apparatus in a manner similar to Embodiment 1. The X-ray diffraction teaches us that a normal on the GaN crystal surface inclines at an angle less than 0.6 degree to a normal on the GaN(0001) plane on the whole GaN surface. The fluctuation of normals on the GaN(0001) planes is 0.5 degree on the whole GaN surface. The distortion of the wafers is measured. The heights H at the center of the wafers are about H=15 μm (for 2-inch diameter: D=50 mm). The equation $R=D^2/8H$ gives R=20000 mm for H=15 μm of D=50 mm. As mentioned in Embodiment 1, the upper limit is R=1563 mm for carrying out lithography. The distortion of Embodiment 2 (1/R=1/20000 mm) is far less than the photolithography limit (1/R=1/1563). The very small distortion allows the photolithography to depict patterns on the GaN wafers of Embodiment 2.

(8) Electric and Optical Properties

Electric properties are measured for all the wafers produced from the ingot. The electrical properties depend upon the height of the wafer in the ingot.

The top GaN wafer which is grown at the latest stage exhibits n-type conduction, an n-carrier concentration of $5 \times 10^{18}$ cm$^{-3}$, an electron mobility of 200 cm$^2$/Vsec and resistivity of 0.017 Ωcm.

The bottom GaN wafer which is grown at the earliest stage exhibits n-type conduction, an n-carrier concentration of $10^{18}$ cm$^{-3}$, an electron mobility of 150 cm$^2$/Vsec and resistivity of 0.01 Ωcm.

Intermediate wafers show intermediate properties between the top wafer and the bottom wafer.

(9) Measurement of Optical Absorption Coefficients

These wafers are colorless transparent or grayish transparent. Bare optical absorption coefficient is 20 cm$^{-1}$ to 40 cm$^{-1}$ for a wavelength range between 400 nm and 600 nm.

(10) Fabrication of LEDs

This invention affords wide GaN bulk single crystal wafers to the GaN devices for the first time. LEDs having an InGaN active layer are fabricated upon the wide GaN single crystal wafers. The illumination intensity of the LED/GaN of the present invention is about five times stronger than the conventional LED/sapphire. The enhancement of the illumination intensity results from a decrease of dislocations in the LED. The conventional sapphire substrate allows occurrence of plenty of piercing dislocations in the active layer which reduce the light power. The GaN substrate of the present invention suppresses the dislocations by preventing the dislocations from pervading into the epitaxial films.

[Embodiment 3 (Seed of MOC, Lateral Growth, GaN Ingot of HVPE)

Embodiment 3 aims at making long GaN single crystal ingots by the HVPE from a MOC-grown GaN seed crystal. A GaAs (111) B wafer of a 2-inch diameter (50 mm) is prepared. A $SiO_2$ mask is grown upon the GaAs substrate to a thickness of 0.1 μm (100 nm) by the plasma CVD method like Embodiments 1 and 2. <1-10> striped parallel windows are perforated in the $SiO_2$ mask by photolithography (like sample 3 of Embodiment 1). Here, the mask stripe width is 2 μm and the window width is 6 μm. The spatial period is 8 μm.

(1) Formation of a GaN Buffer Layer (MOC Method)

A buffer layer of about 90 nm is grown on the <1-10> masked GaAs substrate at a low temperature of about 490° C. by an MOC (metallorganic chloride) apparatus unlike Embodiments 1 and 2.

(2) Formation of an Epitaxial Layer (MOC Method)

When the buffer layers have been formed, the GaAs substrate is heated from 490° C. up to about 970° C. in the same MOC apparatus. An epitaxial GaN layer is further piled to a thickness of 25 μm (2500 nm) on the GaN buffer layers and the mask by the MOC method.

(3) Elimination of the GaAs Substrate

The samples having a GaN/mask/GaAs structure are taken out of the MOC apparatus. It is verified that a continual GaN crystal with a mirror surface is formed on the substrate. The direction of the mask stripes is turned out to be GaN[11-20] direction. Namely, GaN[11-20] orientation grows on GaAs[1-10] orientation in the GaN/mask/GaAs structure. The GaN/mask/GaAs samples are placed in an etching apparatus for eliminating the GaAs substrate by aqua-regina completely.

(4) Production of Thick GaN Ingots From the GaN Seeds (HVPE Method)

The GaN crystal samples are washed. The samples are pure GaN wafers of a 25 μm thickness. The GaN samples are still too thin to be a substrate. The MOC-made GaN wafer is put on the susceptor as a seed in the HVPE apparatus of FIG. 8 and is heated up to 1000° C. A thick GaN crystal is further homoepitaxially grown on the GaN seed to an ingot, as shown in FIG. 7(1). The GaN crystal is a cylindrical ingot having a diameter of about 50 mm. The height of the lowest part is about 30 mm.

(5) Cutting the GaN Ingot Into GaN Wafers by a Slicer

The GaN ingot sustained by a supporter is cut in the direction perpendicular to the axis by an inner blade slicer into a plurality of GaN wafers, as shown in FIG. 7(2). The 30 mm long ingot produces 25 GaN single crystal as-cut wafers of an about 50 mm outer diameter and a 400 $\mu$m thickness. The components of the GaN wafers are analyzed. The concentrations of arsenic (As) and carbon (C) are below the background level.

(6) Polishing

The GaN wafers are lapped and polished. Both surface or one surface is polished to be a mirror surface, as shown in FIG. 7(3). All the polished wafers are nearly distortion-free. The wafers are transparent.

(7) Electric Properties

Electric properties are measured for all the wafers produced from the ingot. All the samples show n-type conduction. An average electron mobility is 250 cm$^2$/Vs. An average resistivity is 0.05 $\Omega$cm.

(8) X-ray Diffraction Analysis

The angular relation between the orientation of the GaN surface and the orientation of the GaN(0001) plane is investigated by the X-ray diffraction apparatus in a manner similar to Embodiments 1 and 2. The X-ray diffraction reveals the fact that a normal on the GaN crystal surface inclines at an angle less than ±1.1 degrees to a normal on the GaN(0001) plane on the whole GaN surface. The fluctuation of normals on the GaN(0001) planes is 1.4 degrees on the whole GaN surface.

(9) Distortion

The distortion of the wafers is measured. The average height H at the center of the wafers is about H=45 $\mu$m (for 2-inch diameter: D=50 mm). The equation R=D$^2$/8H gives R=6900 mm for H=45 $\mu$m of D=50 mm. The distortion of Embodiment 3 (1/R=1/6900 mm) is less than the photolithography limit (1/R=1/1563). The small distortion allows the photolithography to depict patterns on the GaN wafers of Embodiment 3.

The advantages of Embodiments 2 and 3 are explained. Embodiments 2 and 3 make thick GaN single crystal ingots epitaxially on the GaN seeds made by the lateral growth of the HVPE and the MOC, cut the GaN ingot by a slicer into a plurality of wafers, for example, 20 wafers and 25 wafers. The production cost of a wafer of Embodiments 2 and 3 is reduced to 64% of the cost of Embodiment 1 which makes a single GaN wafer. Low cost GaN wafers feature Embodiments 2 and 3. The time for production including the time of quality control is reduced in comparison to Embodiment 1. The residual As and C concentration is the background level.

With regard to the lateral growth, the dotted window mask as shown in FIG. 3, FIG. 4 or FIG. 5 is the best among the three types of masks, since the windows are perforated on the mask at apexes of equilateral triangles. The other striped masks, however, are available due to the effect of reducing the internal stress of growing GaN crystals. The lateral growth succeeds in making GaN single crystal wafers of good quality by reducing the contact area between the GaAs substrate and the growing GaN, decreasing the internal stress by the mask, inhibiting defects from occurring in growing GaN crystals and suppressing the thermal distortion.

[Embodiment 4 (Relation Among Ga Partial Pressure, Surface Morphology and Internal Stress)]

GaN wafers are produced by the HVPE apparatus adopting three types of masks of [1-10] striped window mask, [11-2] striped window mask and dotted window mask like Embodiment 1. The material gas of the HVPE is (H$_2$+HCl) and (H$_2$+NH$_3$). The Ga partial pressure and NH$_3$ partial pressure are monitored in the vicinity of the GaAs substrates. Various GaN wafers are made by changing the conditions of the substrate temperature, the growth time, the Ga partial pressure and the NH$_3$ partial pressure. An enhancement of the Ga partial pressure degrades the surface morphology but reduces the internal stress.

TABLE 2

Relation between surface morphology and distortion

| Sample symbol | Growth temperature (° C.) | Growth time (min) | Ga partial pressure (kPa) | NH$_3$ partial pressure (kPa) | Surface morphology | Thickness ($\mu$m) | Distortion radius (mm) | Internal stress (MPa) |
|---|---|---|---|---|---|---|---|---|
| α | 1030 | 180 | 1 | 4 | smooth | 35 | 54 | 26 |
| β | 1030 | 180 | 1 | 6 | smooth | 40 | 58 | 28 |
| γ | 970 | 180 | 2 | 6 | rough | 120 | 1000 | 4 |
| δ | 970 | 180 | 1 | 6 | smooth | 60 | 225 | 11 |
| ε | 970 | 180 | 1 | 6 | smooth | 40 | 61 | 26 |
| ζ | 1020 | 240 | 2 | 6 | rough | 300 | 10417 | 1.2 |
| η | 1020 | 240 | 1 | 6 | smooth | 120 | 167 | 29 |
| θ | 1030 | 240 | 1 | 6 | smooth | 70 | 125 | 23 |
| ι | 970 | 360 | 2 | 6 | rough | 200 | 1488 | 5.4 |
| κ | 970 | 180 | 2 | 12 | rough | 200 | 1359 | 5.9 |
| λ | 970 | 180 | 2 | 24 | rough | 200 | 2604 | 3.1 |

Table 2 denotes sample symbols, growth temperature, growth time, Ga partial pressure, NH$_3$ partial pressure, surface morphology, thickness, distortion radius and internal stress of the samples. The samples α to λ are classified into two categories A and B. Six samples α, β, δ, ε, η and θ belong to category A. Five samples γ, ζ, ι, κ and λ belong to category B.

(Category A: Blank Rounds)

The Ga partial pressure is 1 kPa (10$^{-2}$ atm) commonly for α, β, δ, ε, η and θ of category A. GaN epitaxial layers are grown commonly at 970° C. for one hour on the buffer layer on the masked GaAs. In addition, GaN layers are further grown on the conditions listed on Table 2. For example, sample a grows the GaN epitaxial layer at 970° C. for one hour at a first step and grows further the GaN at 1030° C. for 3 hours at a second step. The total growth time is 4 hours.

Table 2 shows the temperature of the second step and the total growth time. The six samples of category A have smooth surfaces with good morphology. The surface state is good. But category A has a drawback of large internal stress. The large internal stress invites cracks on some samples.

Figure 13:
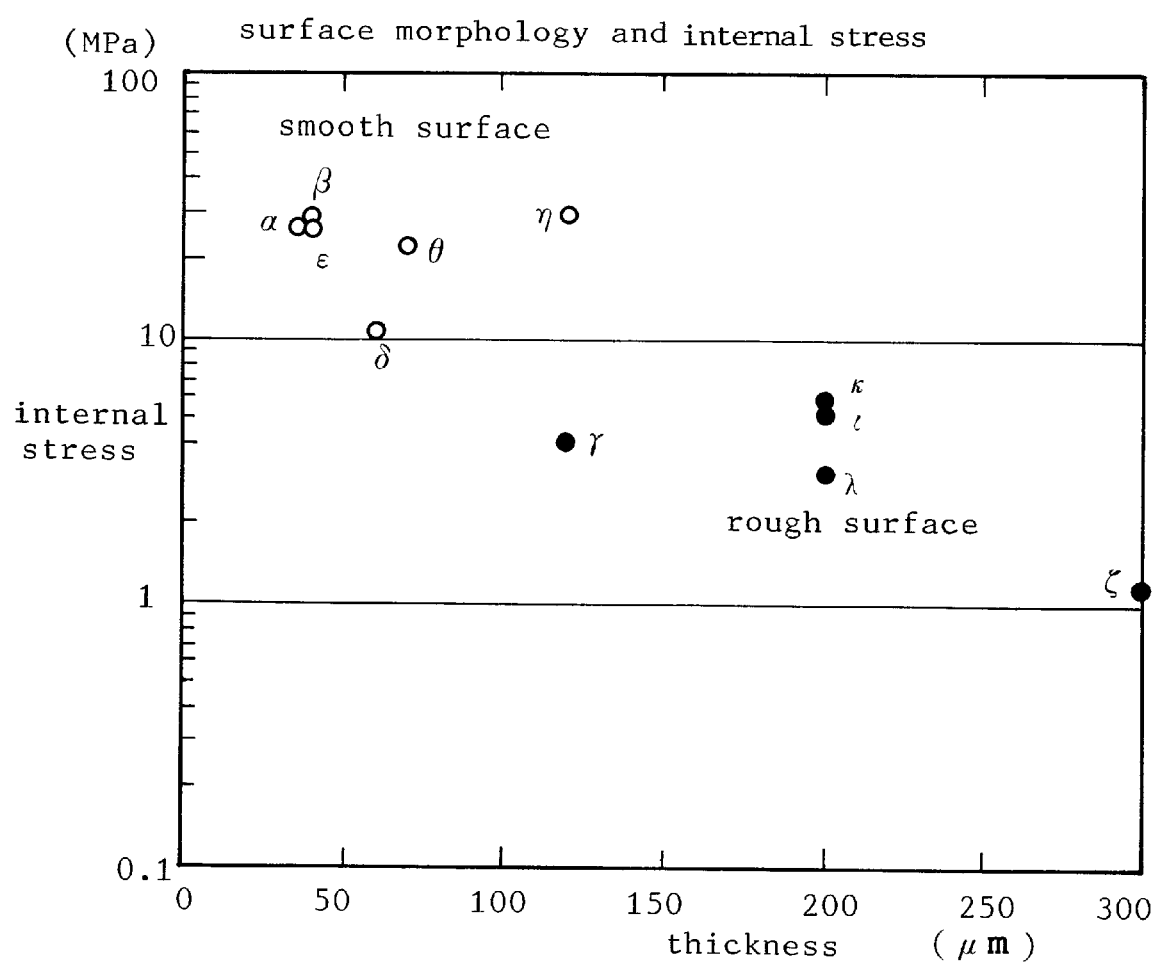
FIG. 13 is a graph for showing the relation between the internal stress and the thickness of the samples (blank rounds) of category A made on the conditions of the gas supply of 900 sccm to 1800 sccm and the Ga partial pressure of 1 kPa, and the samples (black rounds) of category B made on the conditions of the gas supply of 900 sccm and the Ga partial pressure of 2 kPa. Category A(blank) has a smooth surface, strong stress and a small thickness. Category B(black) has a rough surface, weak stress and a large thickness.

FIG. 13 shows the relation between the internal stress and the thickness of 11 samples of Embodiment 4. The abscissa is the thickness ($\mu$m). The ordinate is the internal stress (MPa). Six blank rounds denote the samples $\alpha$, $\beta$, $\delta$, $\epsilon$, $\eta$ and $\theta$ of category A. The thicknesses of category A disperse between 30 $\mu$m and 120 $\mu$m. The internal stresses of category A are populated from 10 MPa to 30 MPa. Category A shows big internal stress more than 10 MPa. But less than 7 Mpa ($7\times10^{-3}$ GPa) is desirable for the following wafer process. Reduction of the internal stress is required for category A. Distortion radii are populated from R=54 mm to R=167 mm. The large distortion is the another weak point of category A.
(Category B: Black Rounds)

The Ga partial pressure is 2 kPa ($2\times10^{-2}$ atm) commonly for $\gamma$, $\zeta$, $\iota$, $\kappa$ and $\lambda$ of category B. GaN epitaxial layers are grown commonly at 970° C. for one hour on the buffer layer on the masked GaAs. In addition, GaN layers are further grown on the conditions listed on Table 2. For example, samples $\gamma$, $\kappa$ and $\lambda$ are grown at the same temperature for additional two hours. The total growth time is three hours. Sample $\zeta$ grows further the GaN at 1020° C. for additional three hours.

The five samples of category B have rough surfaces with poor morphology. The surface state is bad. Rmax is about 20 $\mu$m. But category B has a strong point of small stress. The thicknesses disperse from 120 $\mu$m to 300 $\mu$m. The size of the wafers is 20 mm×20 mm. The internal stresses range from 1 MPa to 6 MPa for category B, which are far smaller than category A. All the internal stresses are smaller than the critical value (7 MPa). Despite the bad surface morphology, category B excels in the internal stress. The distortion radii disperse from R=1000 mm to R=10417 mm. Small distortion is another strong point of category B.
(X-ray Diffraction Analysis)

The angular relation between the orientation of the GaN surface and the orientation of the GaN(0001) planes is investigated by the X-ray diffraction apparatus in a manner similar to Embodiments 1, 2 and 3. The normals on the GaN(0001) planes incline at angles less than ±2.0 degrees to a normal on the GaN crystal surface on the whole GaN surface. The fluctuation of normals on the GaN(0001) planes is 2.4 degrees on the whole GaN surface. Then, all the samples of categories A and B are polished. After polishing, the distortion heights H are less than 60 $\mu$m for a 2-inch wafer reduction. The distortion radii are larger than R=5200 mm which allows the. photolithography to depict patterns upon the GaN wafers (limit distortion R=1563 mm).
[Embodiment 5 (Distortion Curvature)]

Figure 14:
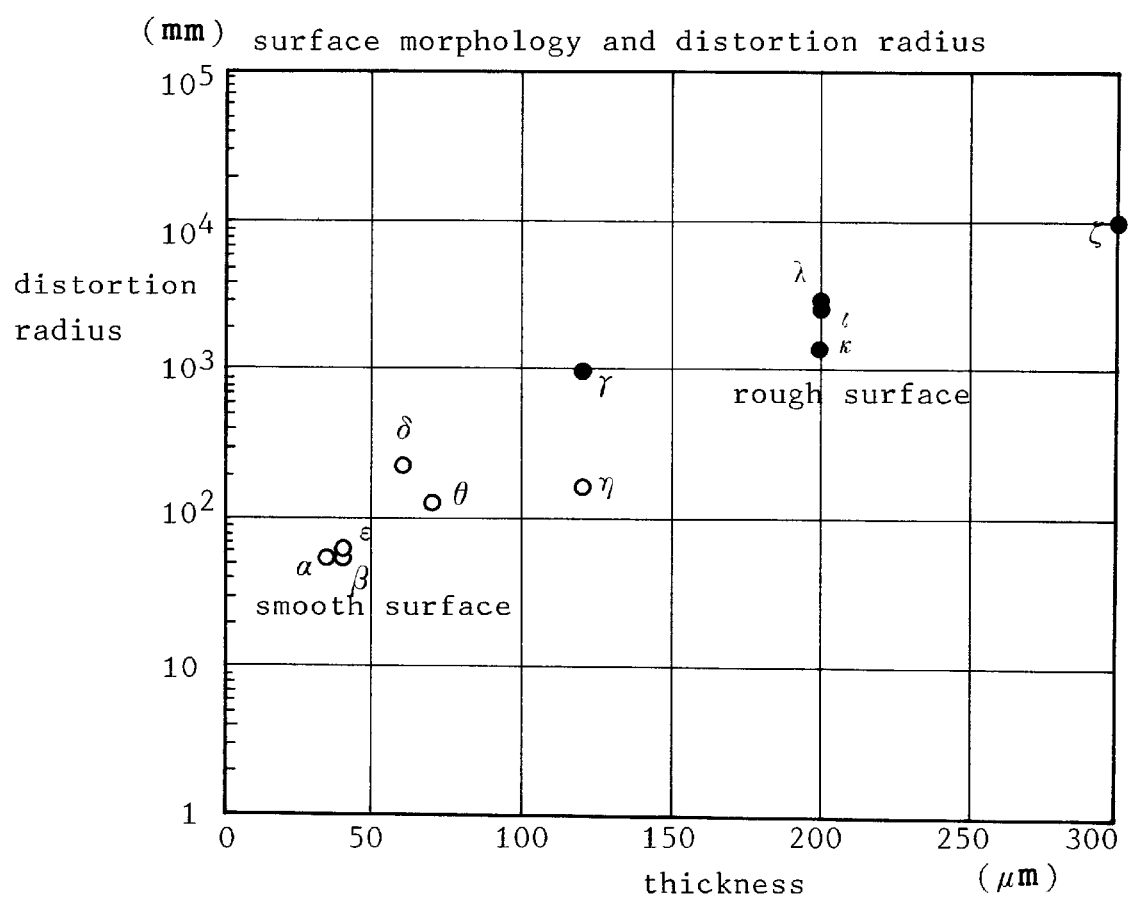
FIG. 14 is a graph for showing the relation between the distortion curvature radius and the thickness of the 6 samples (blank rounds) of category A and the 5 samples (black rounds) of category B. Category A (blank) has a smooth surface, strong distortion and a small thickness. Category B (black) has a rough surface, weak distortion and a large thickness.

The same 11 samples of Embodiment 4 (category A and category B) are further investigated for clarifying the relation between the distortion radius and the thickness. The distortion heights H are measured by the needle contact method. FIG. 14 shows the result of the distortion measurement. The abscissa is the thickness ($\mu$m). The ordinate is the distortion curvature radius. The preferable distortion radius is larger than R=600 mm. The lower limit of the photolithography is R=1563 mm for 2-inch wafers as explained in the column of Embodiment 1.
(Category A: Blank Rounds)

Samples $\alpha$, $\beta$, $\delta$, $\epsilon$, $\eta$ and $\theta$ have smaller thicknesses with smooth surfaces but have large distortion. The distortion radii are smaller than 225 mm. All the six samples of category A fail in satisfying the requirement that R should be larger than 600 mm.
(Category B: Black Rounds)

Samples $\gamma$, $\zeta$, $\iota$, $\kappa$ and $\lambda$ have larger thicknesses with rough surfaces but have small distortion. The distortion radii of all the samples of category B are larger than the critical value R=600 mm. Category B succeeds in satisfying the requirement.

In addition, the GaN grown directly on GaAs without masks has a very small distortion radius and strong internal stress, which breaks the GaN crystal itself
[Embodiment 6 (Polishing)]

All the samples of category A are broken at the polishing step. Sample $\iota$ of category B, which has a 200 $\mu$m thickness, 5.4 MPa internal stress, a 1488 mm distortion radius and Rmax20 $\mu$m roughness, can be polished to a 80 $\mu$m thickness without break. Polishing enhances the distortion radius from 1488 mm to 3500 mm and reduces the surface roughness from Rmax 20 $\mu$m to Rmax 7.2 nm and Ra2 nm. Polishing is effective both to smooth the surface and to reduce the distortion for category B.
(X-ray Diffraction Analysis)

The angular relation between the orientation of the GaN surface and the orientation of the GaN(0001) planes is investigated for the polished samples of category B by the X-ray diffraction apparatus in a manner similar to Embodiments 1, 2, 3 and 4. Normals on the GaN(0001) planes incline at angles less than ±1.7 degrees to a normal on the GaN crystal surface on the whole GaN surface. The fluctuation of normals on the GaN (0001) planes is 3.7 degrees on the whole GaN surface. The distortion heights of all the polished samples of category B are less than 90 $\mu$m for 2-inch wafers. The distortion radii are larger than R=3400 mm which enables the photolithography to depict patterns upon the GaN wafers (limit distortion R=1563 mm).
[EMBODIMENT 7 (Anisotropy of the Internal Stress in Wafer)]

The anisotropy of internal stress is investigated for both the GaN wafers ($\mu$) made by the striped window mask and the GaN wafers ($\nu$) made by the dotted window mask.
Sample ($\mu$) . . . 120 $\mu$m average thick GaN wafers made by producing a GaAs<11-2> striped window mask on a GaAs(111) wafer, piling GaN buffer layers and GaN epitaxial layers, and etching the GaAs substrate away.
Sample ($\nu$) . . . 160 $\mu$m average thick GaN wafers made by producing a dotted window mask (FIG. 3) on a GaAs(111) wafer, piling GaN buffer layers and GaN epitaxial layers, etching the GaAs substrate away.

Both samples are grown by the same conditions of a Ga partial pressure of $1\times10^{-2}$ atm(1 kPa), a NH$_3$ partial pressure of 0.24 atm (24 kPa), a growth time of 240 hour and a growth temperature of 970° C. After the growth, the GaN substrates are cooled and taken out from the HVPE apparatus. The GaAs substrates are etched away for obtaining freestanding GaN wafers. The anisotropy of the internal stress is measured by X-rays for both samples.

Figure 17:
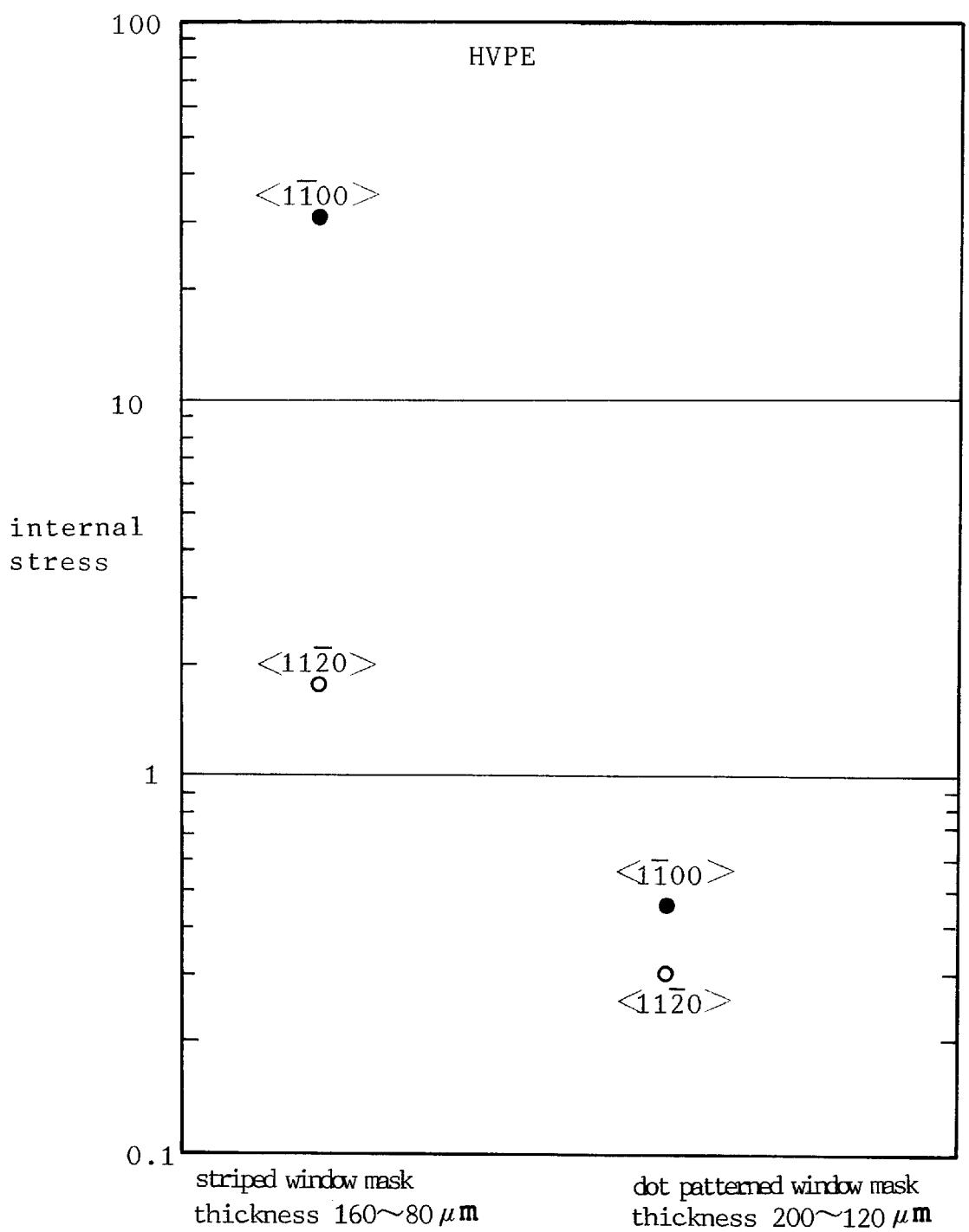
FIG. 17 is a graph showing the anisotropy of the internal stress in the GaN crystals made by using the dotted window mask and the striped window mask. The ordinate is the internal stress. The left column denotes the internal stress in the striped window mask-made GaN. The right column denotes the internal stress in the dotted window mask-made GaN.

FIG. 17 shows the result of the measurement of the anisotropic internal stress. The left half column denotes the data of sample $\mu$ of the striped mask. The right half column denotes the data of sample $\nu$ of the dotted mask. Sample $\nu$ made by the dotted mask has small internal stress and small anisotropy of the internal stress. The reason is that the dotted mask has little anisotropy. Sample $\mu$ made by the striped mask, however, has large internal stress and large anisotropy of the internal stress. The <1-100> -directed internal stress is about 30 MPa. The <11-20>-directed internal stress is about 1.9 MPa. The <1-100>-directed internal stress is larger than ten times of the <11-20>-directed internal stress. GaAs<1-10>corresponds to GaN<11-20>. GaAs<11-2> corresponds to GaN<1-100>. GaN<11-20> is vertical to GaN<1-100>. The initial mask stripes are parallel to GaAs<11-2>. The direction of GaN<1-100> of the largest internal stress is just equal to the direction of the mask stripes. This fact confirms the excellence of the dotted window mask to the striped window mask.

What is claimed is:

1. A GaN single crystal substrate having a diameter longer than 20 mm, a thickness more than 0.07 mm and being freestanding.

2. A GaN single crystal substrate as claimed in claim 1, wherein the GaN substrate is colorless and transparent.

3. A GaN single crystal substrate as claimed in claim 1, wherein the GaN substrate is transparent but yellowish, brownish or grayish.

4. A GaN single crystal substrate as claimed in claim 1, wherein an absorption coefficient for light is less than 120 cm$^{-1}$ for a wavelength range between 400 nm and 600 nm.

5. A GaN single crystal substrate as claimed in claim 1, wherein intrinsic internal stress is less than 7 MPa.

6. A GaN single crystal substrate as claimed in claim 1, wherein a curvature radius of distortion is more than 600 mm.

7. A GaN single crystal substrate as claimed in claim 1, wherein a distortion height at a center of the substrate is less than 0.55 mm for a 2 inch diameter.

8. A GaN single crystal substrate as claimed in claim 1, wherein a concentration of As is less than $10^{17}$ cm$^{-3}$.

9. A GaN single crystal substrate as claimed in claim 1, wherein the GaN substrate substantially does not include carbon.

10. A GaN single crystal substrate as claimed in claim 1, wherein the GaN substrate has a top surface and a bottom surface, and one or both of them are polished.

11. A GaN single crystal substrate as claimed in claim 10, wherein normals on low index planes of GaN crystals nearly parallel to the surface of the GaN substrate incline at an angle less than 3 degrees to a normal on the substrate surface.

12. A GaN single crystal substrate as claimed in claim 11, wherein fluctuation of normals of low index planes of GaN crystals nearly parallel to the surface of the GaN substrate is less than 4 degrees.

13. A GaN single crystal substrate as claimed in claim 10, wherein a distortion height of the GaN after being polished is less than 200 µm for 2-inch diameter.

14. A GaN single crystal substrate as claimed in claim 10, wherein the surface is a GaN(0001) plane.

* * * * *